United States Patent [19]
Miyamoto et al.

[11] Patent Number: 5,635,735
[45] Date of Patent: Jun. 3, 1997

[54] FIELD EFFECT TRANSISTOR WITH AN IMPROVED SCHOTTKY GATE STRUCTURE

[75] Inventors: Hironobu Miyamoto; Kazuhiko Onda, both of Tokyo, Japan

[73] Assignee: NEC Corporation, Tokyo, Japan

[21] Appl. No.: 252,251

[22] Filed: Jun. 1, 1994

[30] Foreign Application Priority Data

Jun. 1, 1993 [JP] Japan ................................ 5-130481

[51] Int. Cl.$^6$ .................. H01L 31/0328; H01L 31/0336
[52] U.S. Cl. ............................................ 257/192; 257/194
[58] Field of Search ................................. 257/192, 194, 257/190, 200, 20, 15

[56] References Cited

U.S. PATENT DOCUMENTS

| | | | |
|---|---|---|---|
| 4,484,207 | 11/1984 | Nishizawa et al. | 257/192 |
| 5,038,187 | 8/1991 | Zhou | 257/194 |
| 5,053,835 | 10/1991 | Horikawa et al. | 257/190 |
| 5,206,528 | 4/1993 | Nashimoto | 257/192 |
| 5,343,057 | 8/1994 | Gerard et al. | 257/192 |

FOREIGN PATENT DOCUMENTS

| | | |
|---|---|---|
| 0452054 | 10/1991 | European Pat. Off. . |
| 0522952 | 1/1993 | European Pat. Off. . |
| 0551110 | 7/1993 | European Pat. Off. . |
| 1-041272 | 2/1989 | Japan . |
| 1-41273 | 2/1989 | Japan . |
| 64-41272 | 2/1989 | Japan . |
| 64-41273 | 2/1989 | Japan . |

OTHER PUBLICATIONS

U. Mishra, "The AlInAs–GaInAs HEMT for Microwave and Millimeter–Wave Applications", IEEE, Sep. 1989, vol. 37, No. 9, pp. 1279–1285.

N. Iwata et al., "High Performance Double–Doped InAlAs/ InGaAs/InP Hetrojunction Fet with Potential for Millimetre–Wave Power Applications", Electronic Letters, Apr. 1993, vol. 29, No. 7, pp. 628–629.

S. Fujita et al., "InGaAs/InAlAs HEMT with a Strained InGaP Schottky Contact Layer", IEEE Electron Device Letters, May 1993, vol. 14, No. 5, pp. 259–261.

By S. Fujita et al., "InGaAs/InAlAs HEMT with a Strained InGaP Schottky Contact Layer", IEEE Electron Device Letters, May 1993, vol. 14, No. 5, pp. 259–261.

By C. Heedt et al, "Extremely low gate leakage InAlAs/ InGaAs HEMT", Inst. Phys. Conf. Serv, 1992, Chapter 12, No. 129, pp. 941 and 942.

Iwaka et al; "High Performance Double Doped InAlAs/ InGaAs/InP Heterojunction FET . . . "; Electronic Letters Apr. 1993; vol. 29, No. 7; pp. 628–629.

*Primary Examiner*—Wael Fahmy
*Attorney, Agent, or Firm*—Young & Thompson

[57] ABSTRACT

The invention provides a Schottky barrier structure comprising a Schottky gate electrode, a first layer in contact with said Schottky gate electrode and said first layer being made of a first compound semiconductor and a second layer in contact with said first layer and said second layer being made of a second compound semiconductor having a higher conduction band edge than a conduction band edge of said first compound semiconductor.

48 Claims, 12 Drawing Sheets

FIELD EFFECT TRANSISTOR WITH AN IMPROVED SCHOTTKY GATE STRUCTURE

BACKGROUND OF THE INVENTION

The invention relates to a semiconductor device, and more particularly to a high frequency and high speed field effect transistor with an improved Schottky gate structure.

Improvements and developments of high frequency and high speed field effect transistors made of compound semiconductors such as InP, InGaAs or other compound semiconductors including In are very important for revolutions in semiconductor field. Compound semiconductors such as InP, InGaAs and other compound semiconductors including In are suitable for high frequency and high speed fiend effect transistors as having a property of a high electron mobility. Such high electron mobility field effect transistor showing high frequency and high speed performances have a Schottky gate contact. Namely, a gate electrode made of a metal has to be provided directly on a semiconductor layer so that the gate electrode is electrically separated from the semiconductor layers through the Schottky barrier. As well known, a semiconductor-metal contact or Schottky contact provides a conduction band discontinuity which serves as a potential barrier or Schottky barrier which prevents electrons acting as carriers to flow across the Schottky contact from the metal toward the semiconductor. A sufficient height of the Schottky barrier is necessary to suppress a gate leakage current or to suppress electrons to flow across the Schottky contact from the metal toward the semiconductor.

Using InP or InGaAs for high frequency and high speed transistors is disclosed in U.K. Mishra 1989 IEEE Transaction on Microwave Theory and Techniques, Vol. 37, No. 9 p. 1279. The structure of the deice is as follows. A substrate is a semi-insulating InP substrate. A buffer layer made of InAlAs is formed on the semi-insulating InP substrate. A non-doped InGaAs layer is formed on the InAlAs buffer layer. An n-type InAlAs layer is formed on the non-doped InGaAs layer to form a hereto junction therewith. A non-doped InAlAs layer is formed on the n-type InAlAs layer. The above layers may sequentially be grown on the substrate. A gate electrode is provided on the non-doped InAlAs layer to form a Schottky contact therewith.

The non-doped InAlAs layer is provided to form a Schottky barrier in cooperation with the gate electrode. Such the Schottky barrier serve to prevent electrons acting as carriers to flow across the Schottky contact surface. Although the non-doped InAlAs layer is provided to suppress a gate leakage current, a Schottky barrier height is 0.55 eV which seems insufficient to suppress a gate leakage current in view of a voltage applied to the gate electrode. Much more high Schottky barrier is required to realize a sufficient suppression of the gate leakage current or to suppress electrons acting as carriers to move across the Schottky contact surface from the metal region of the gate electrode into the semiconductor region.

Another high electron mobility transistor is disclosed in May 1993 IEEE Electron Device Letters, Vol. 14, No. 5 pp.-259–261. The structure of the transistor is as follows. A semiconductor substrate is a semi-insulating InP substrate. An undoped InP layer having a thickness of 10 nanometers is formed on the semi-insulating InP substrate. An undoped InGaAs layer having a thickness of 20 nanometers is formed on the undoped InP layer. An undoped InAlAs layer having a thickness of 3 nanometers is formed on the undoped InGaAs layer. An n$^+$-doped InAlAs layer having a thickness of 15 nanometers and an impurity concentration of $3 \times 10^{18}$ cm$^{-3}$ is formed on the undoped InAlAs layer. An undoped In$_{0.75}$Ga$_{0.25}$P layer having a thickness of 10 nanometers is formed on the n$^+$-doped InAlAs layer. A recess etched cap layer made of n$^+$-doped InGaAs having a thickness of 20 nanometers and an impurity concentration of $5 \times 10^{18}$ cm$^{-3}$ is formed on the undoped In$_{0.75}$Ga$_{0.25}$P layer. Source and drain electrodes are provided on the cap layer. A gate electrode is provided on an exposed surface of the undoped In$_{0.75}$Ga$_{0.25}$P layer in a recess portion. This transistor is so designed as to allow high frequency and high speed performances, while a Schottky barrier height is insufficient for a potential barrier to suppress a gate leakage current or prevent electrons acting as carriers to flow across the Schottky interface from the gate into the In$_{0.75}$Ga$_{0.25}$P layer. Much more high Schottky barrier is also needed.

To combat the above problems as to the gate leakage current, another Schottky gate structures were proposed and disclosed in the Japanese laid-open patent applications Nos. 64-41272 and 64-41273. The Japanese laid-open patent application No. 64-41272 describes inserting a superlattice structure of AlGaAs/AlInAs under the gate electrode in which the superlattice structure may serve as a potential barrier to suppress a gate leakage current or prevent electrons acting as carriers to flow across the Schottky contact surface into an Al$_{0.48}$In$_{0.52}$As layer. The Japanese laid-open patent application No. 64-41273 also describes inserting an Al$_{0.4}$Ga$_{0.6}$As layer under the gate electrode in which the superlattice structure may serve as a potential barrier to suppress a gate leakage current or prevent electrons acting as carriers to flow across the Schottky contact surface into an Al$_{0.48}$In$_{0.52}$As layer. The Al$_{0.4}$Ga$_{0.6}$As layer is required to have a thickness less than a critical thickness of approximately 10 nanometers in view of lattice matching. The superlattice structure of AlGaAs/AlInAs is also required to have the sum of individual thicknesses of AlGaAs layers less than a critical thickness which is very thin.

Typical structure of the above field effect transistors are illustrated in FIG. 1. The field effect transistor has an InP semi-insulating substrate 101. A layer 102 made of compound semiconductors including In is formed on the InP semi-insulating substrate 101. An InAlAs layer 103 is formed on the layer 102. An AlGaAs layer 104 is formed on the InAlAs layer 103. Recess etched n-doped InGaAs cap layers 107-1 and 107-2 serving as source and drain regions are formed on the AlGaAs layer 104. Source and drain electrodes 108-1 and 108-2 are provided on the source and drain regions 107-1 and 107-2. A gate electrode 109 is provided in a recess portion. The AlGaAs layer constitutes a potential barrier against electrons serving as carriers to prevent electrons flow across a Schottky contact from the gate electrode 109 into the InAlAs layer 103 so as to suppress a Schottky gate leakage current.

Such Schottky barrier structures are engaged with the following problems in fabricating the device. Recess etching of the cap layer serving as source and drain regions is necessary to form such a Schottky barrier gate. Although the recess etching is continued until the barrier layer is exposed, it is difficult to control the recess etching to discontinue the recess etching just when a surface of the barrier layer is exposed in view of etching accuracy. Actually, the AlGaAs layer serving as a potential barrier seems to suffer damage from the recess etching process to form a recess portion in which the Schottky gate electrode is provided. The potential barrier layer, once damaged due to the recess etching process, is no longer able to serve a potential barrier for suppressing a gate leakage current. This is the serious problem. The above superlattice structure serving as a potential barrier is also engaged with the same problem as described above. It would be required to develop a potential barrier structure in which the potential barrier layer is free from any damage due to the recess etching.

Another high electron mobility transistor having a potential barrier structure against holes acting as positive carriers in which a potential barrier layer is provided adjacent to a channel layer is disclosed in Inst. Phys. Conf. Ser. No 129 Chapter 12, pp. 941–942. The structure of high electron mobility transistor is as follows. A semiconductor substrate is a InP substrate. A buffer layer is formed on the semiconductor substrate. An InGaAs channel layer having a thickness of 40 nanometers is formed on the buffer layer. An n-doped InAlAs spacer layer having a thickness of 1.5 nanometers is is formed on the InGaAs channel layer. An InAlAs hole barrier layer having a thickness of 3 nanometers is formed on the n-doped InAlAs spacer layer. An n-doped InAlAs spacer Layer having a thickness of 1.5 nanometers is formed on the InAlAs hole barrier layer. An $n^+$-doped InAlAs layer having a thickness of 11 nanometers is formed on the n-doped InAlAs spacer layer. An n-doped InAlAs layer having a thickness of 20 nanometers is formed on the $n^-$-doped InAlAs layer. A recess etched cap layer made of InGaAs is formed on the n-doped InAlAs layer. Source and drain electrodes are provided on the cap layer. A gate electrode is provided on an exposure surface of the n-doped InAlAs in the recess portion to form a Schottky contact structure.

The InAlAs hole barrier layer is also able to serve as a potential barrier but against holes acting as carriers. The hole barrier layer serves merely as a potential barrier to hole carriers so as to prevent the hole carriers to flow out from the channel layer. For that purpose, it is required to provide the hole barrier layer adjacent to the channel layer. However, such the hole barrier layer would never be a potential barrier against electrons. Actually, it could readily be appreciated that the hole barrier adjacent to the channel layer is unable to suppress electrons to flow across the Schottky barrier from the Schottky gate electrode into the semiconductor layers. Although the electron barrier and the hole barrier fill the same role merely in view of suppressing a gate leakage current, the both barriers are on the bases of the completely different principles. Suppressing electron carriers to flow across the Schottky barrier contact surface from the Schottky gate into the semiconductor layer would completely be different technical viewpoint from suppressing hole carriers to flow out from the channel layer. In the former case the electron barrier is required to be provided adjacent to the Schottky gate contact, while in the latter case the hole barrier is required to be provided adjacent to the channel layer.

The prior art discussed above neither describes nor teaches an ideal Schottky barrier structure to suppress electrons to flow across a Schottky contact surface from a Schottky gate electrode into a semiconductor layer in which a Schottky barrier layer provided adjacent to the Schottky contact is free from any damage due to a recess etching process.

It would, therefore, be required to develop a novel Scottky gate structure with an improved electron barrier involved in a high frequency and high speed field effect transistor of compound semiconductors.

SUMMARY OF THE INVENTION

Accordingly, it is a primary object of the present invention to provide a novel Schottky barrier structure having a sufficient potential barrier height to suppress electrons to flow across a Schottky contact surface from a Schottky gate electrode into a semiconductor layer.

It is a further object of the present invention to provide a novel Schottky barrier structure free from any disadvantages as described above.

It is moreover object of the present invention to provide a novel Schottky barrier structure to suppress any gate leakage current.

It is a furthermore object of the present invention to provide a novel high frequency and high speed field effect transistor involving an improved Schottky barrier structure to suppress electrons to flow across a Schottky contact surface from a Schottky gate electrode into a semiconductor layer.

It is a still further object of the present invention to provide a novel high frequency and high speed field effect transistor involving an improved Schottky barrier structure free from any damage due to a recess etching process.

It is yet a further object of the present invention to provide a novel high frequency and high speed field effect transistor involving an improved Schottky barrier structure free from any disadvantages as described above.

It is another object of the present invention to provide a novel high frequency and high speed field effect transistor involving an improved Schottky barrier structure to suppress any gate leakage current.

The above and other objects, features and advantages of the present invention will be apparent from the following descriptions.

The present invention provides a high frequency and high speed field effect transistor having an improved Schottky barrier structure which may include a Schottky gate electrode, a first layer being in contact with the Schottky gate electrode and being made of a first compound semiconductor and a second layer being in contact with the first layer and being made of a second compound semiconductor having a higher conduction band edge than a conduction band edge of the first compound semiconductor. The first compound semiconductor may comprise a compound semiconductor including In such as InAlAs. The second compound semiconductor may comprise AlAs, GaAs, GaP, $In_xAl_{1-x}As$ (0<X<0.4), $Al_xGa_{1-x}As$ (0<X<1), $Al_xGa_{1-x}P$ (0<X<1), $GaAs_yP_{1-y}$ (0<Y<1), $AlAs_{1-y}P_y$ (0<Y<1), $Al_xGa_{1-x}As_{1-y}P_y$ (0<X<1, 0<Y<1), or $Al_xIn_{1-x}As_{1-y}P_y$ (0<X<1, 0<Y<1, 0<X+Y<2). The second layer has a thickness of 5 nanometers. The first layer has a thickness in the range of from 5 nanometers to 10 nanometers.

The Schottky barrier structure may further include a third layer being in contact with the second layer and being made of said first compound semiconductor and a fourth layer being in contact with the third layer and being made of the third compound semiconductor. The fourth layer has a thickness of 5 nanometers. The said third layer has a thickness of 5 nanometers.

BRIEF DESCRIPTION OF THE DRAWINGS

Preferred embodiments of the present invention will hereinafter fully be described in detail with reference to the accompanying drawings.

DESCRIPTIONS OF THE INVENTION

The present invention provides a novel Schottky barrier structure having a sufficient barrier height to prevent electrons serving as carriers to flow across from a Schottky gate electrode into a semiconductor layer. The present invention also provides a novel high frequency and high speed field effect transistor including an improved Schottky barrier structure having a sufficient barrier height to prevent electrons serving as carriers to flow across from a Schottky gate electrode into a semiconductor layer in which a barrier layer is provided relatively adjacent to a Schottky contact surface but be free from any damage due to a recess etching to form a recess portion in which a Schottky gate electrode is provided. The electron barrier layer having such a sufficient barrier height is provided not to be exposed through the recess portion or not directly contact with the Schottky gate electrode so as to keep the electron barrier layer from suffering any damage due to the recess etching process, while the electron barrier layer is required to be in a relatively adjacent position to the Schottky contact surface so as not only to ensure a prevention of electrons acting as carriers to flow across the Schottky contact surface from the Schottky gate electrode into semiconductor layers involving a channel layer. Even when a variation of etching depth in forming a recess portion, a semiconductor layer over the potential barrier layer suffers all damage due to the recess etching so as to permit the electron barrier to be free from any damage due to the recess etching. This also permits the electron barrier layer to be sufficiently thin to be free from any possibility of a generation of a lattice mismatching.

Figure 1:
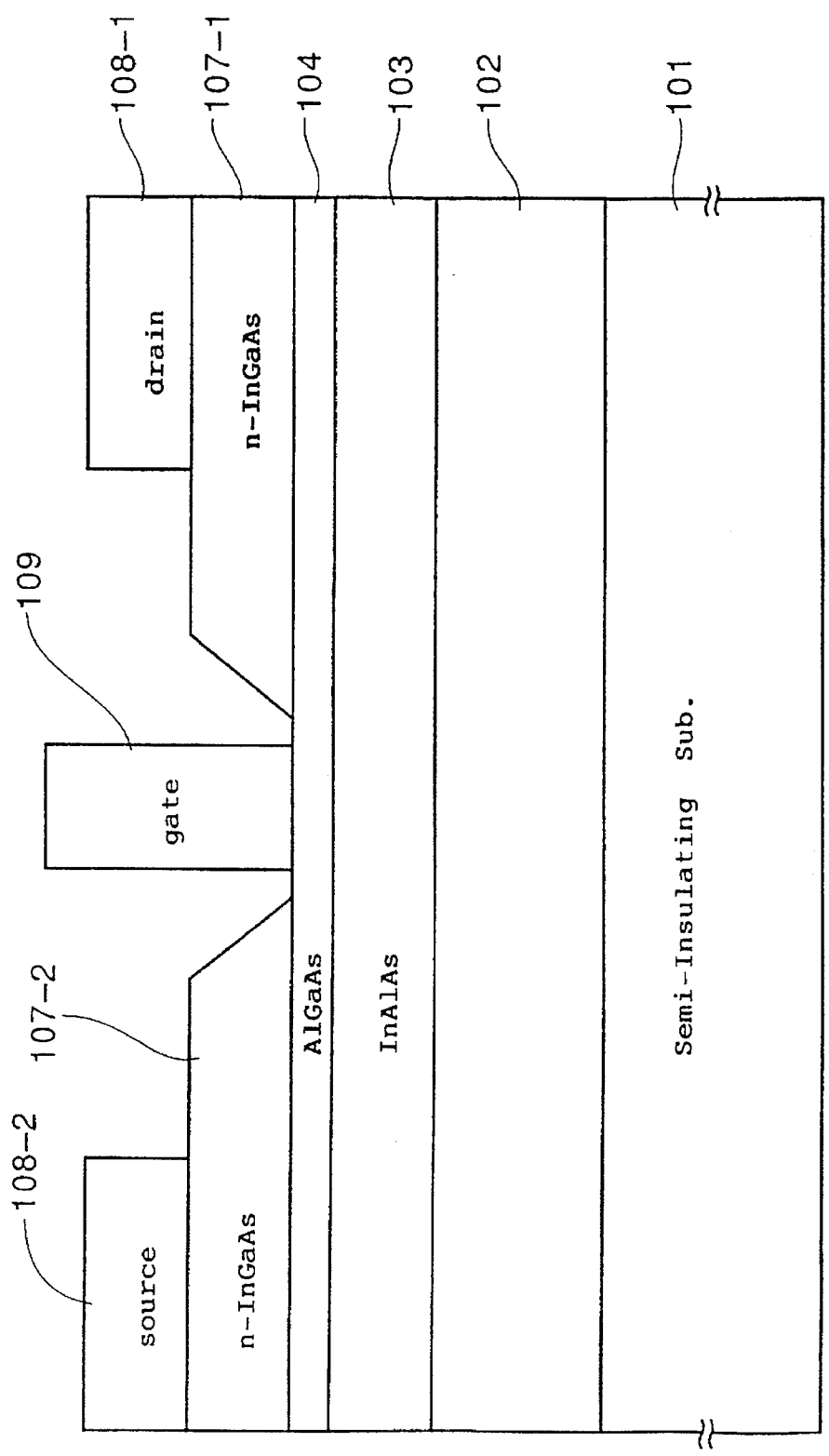
FIG. 1 is a fragmentary cross sectional elevation view illustrative of the field effect transistor having the conventional Schottky barrier structure.
Figure 2:
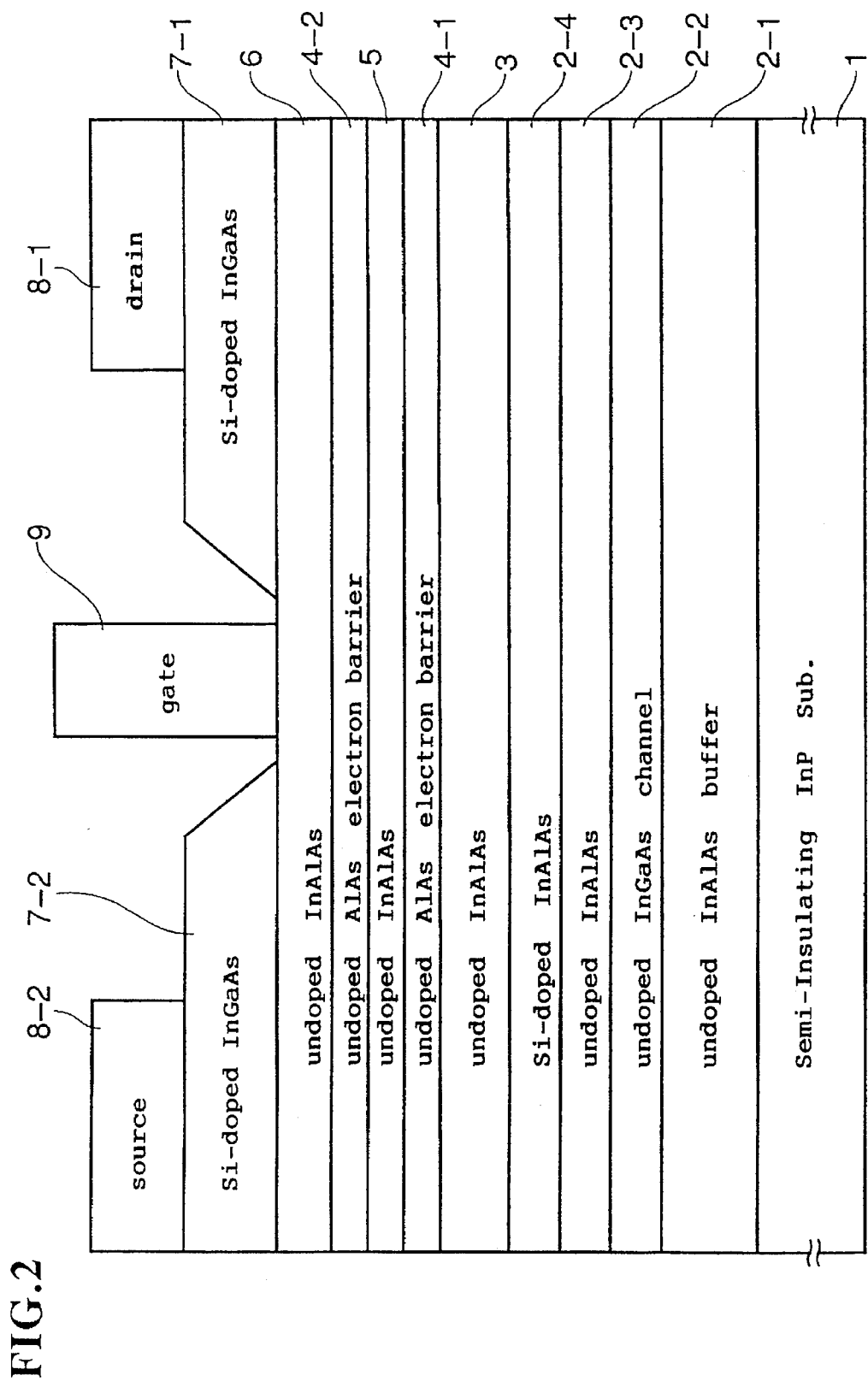
FIG. 2 is a fragmentary cross sectional elevation view illustrative of a novel high frequency and high speed field effect transistor having an improved Schottky barrier structure in a first embodiment according to the present invention.

A first embodiment according to the present invention will hereinafter be described with reference to FIG. 2 in which a novel high frequency and high speed field effect transistor having an improved Schottky gate structure is provided. A structure of the field effect transistor is illustrated in FIG. 2. The transistor has a semi-insulating InP substrate 1. An undoped InAlAs buffer layer 2-1 having a thickness of 300 nanometers is formed on the undoped semi-insulating InP substrate 1. An undoped InGaAs channel layer 2-2 having a thickness of 30 nanometers is formed on the undoped InAlAs buffer layer 2-1. An undoped InAlAs layer 2-3 having a thickness of 3 nanometers is formed on the undoped InGaAs channel layer 2-2. A Si-doped InAlAs layer 2-4 having a thickness of 10 nanometers and an impurity concentration of $5 \times 10^{18}$ cm$^{-3}$ is formed on the undoped InAlAs layer 2-3. An undoped InAlAs layer 3 having a thickness of 20 nanometers is formed on the Si-doped InAlAs layer 2-4. A first electron barrier layer 4-1 made of an undoped AlAs having a thickness of 5 nanometers is formed on the undoped InAlAs layer 3. An undoped InAlAs layer 5 having a thickness of 5 nanometers is formed on the first electron barrier layer 4-1. A second electron barrier layer 4-2 made of an undoped AlAs having a thickness of 5 nanometers is formed on the undoped InAlAs layer 5. An undoped InAlAs layer 6 having a thickness of 10 nanometers is formed on the second electron barrier layer 4-2. A recess etched cap layer made of a Si-doped InGaAs compound semiconductor having an impurity concentration of $6 \times 10^{18}$ cm$^{-3}$ constituting drain and source regions 7-1 and 7-2. Drain and source electrodes 8-1 and 8-2 are provided on the Si-doped InGaAs drain and source regions 7-1 and 7-2. The drain and source electrodes 8-1 and 8-2 may be formed by evaporations of AuGe and Ni and subsequent alloy process therefor. A Schottky gate electrode 9 is provided on an exposed surface of the undoped InAlAs layer 6 in a recess portion.

The channel layer 2-2 made of the undoped InGaAs compound semiconductors has a lowest conduction band edge to provide a higher electron mobility which permits the field effect transistor to exhibit high frequency and high speed performances. The undoped InGaAs channel layer 2-2 is so thin as to permit electrons serving as carriers to be confined to form a two dimensional electron gas in the undoped InGaAs channel layer 2-2. The thickness of the undoped InGaAs channel layer 2-2 is variable. Much more thin undoped InGaAs channel layer having a thickness of 10 nanometers is available in which the number of electrons confined in the channel layer 2-2 is reduced, while the electrons have a high energy in the average. The above undoped InGaAs channel layer having a very small thickness and a very high electron mobility permits the field effect transistor to possess high frequency and high speed performances.

The Si-doped InGaAs drain and source regions 7-1 and 7-2 have a high impurity concentration of 6×10 cm$^{-3}$ to form an ohmic contact with the drain and source electrodes 8-1 and 8-2 respectively. The impurity concentration of the drain and source regions may be variable to place the interface with the metal electrode in condition for a formation of ohmic contact which contributes improvements in high frequency and high speed performance of the field effect transistor.

Figure 12:
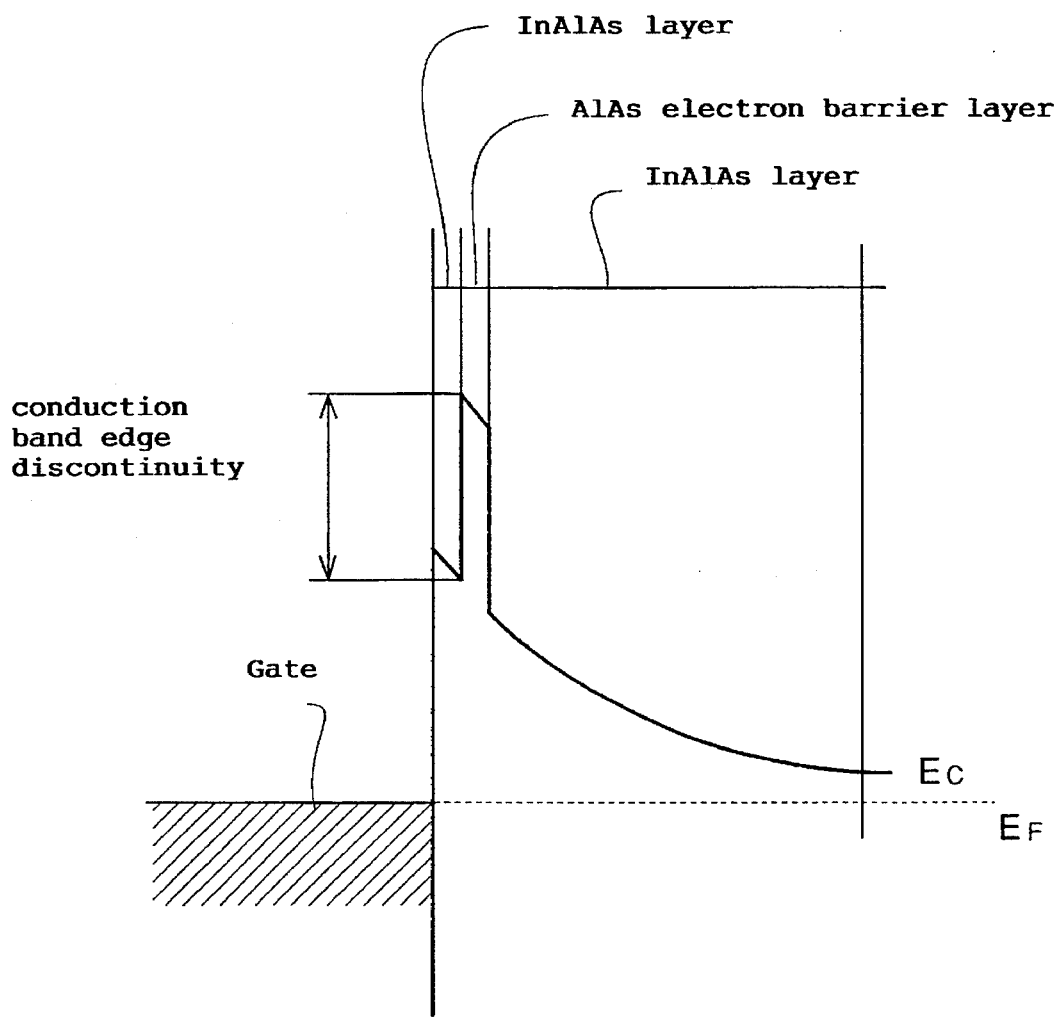
FIG. 12 is a diagram illustrative of an energy band gap profile across a Schottky contact surface of a Schottky barrier structure according to the present invention.

The above field effect transistor in this embodiment has an ideal Schottky barrier structure constituting dual potential barrier having a sufficient height to prevent electrons acting as carriers to flow across the Schottky contact surface from the Schottky gate electrode 9 into the InAlAs layers or the undoped InGaAs channel layer 2-2. The Schottky barrier structure has dual potential barriers comprising the first and second undoped AlAs electron barrier layers 4-1 and 4-2. The first and second dual undoped AlAs electron barrier layers 4-1 and 4-2 are provided at an adjacent portion to the Schottky contact surface to ensure a prevention of electrons acting as carriers to move across the Schottky contact surface from the Schottky gate electrode 9 into the InAlAs layers and the channel layer 2-2. Each of the undoped AlAs electron barrier layers 4-1 and 4-2 has a very small thickness of 5 nanometers which is less than a critical thickness to avoid any appearance of crystal dislocation due to a lattice mismatching between AlAs and InAlAs. The above undoped AlAs electron barrier layers 4-1 and 4-2 are free from any problem with appearance of the crystal dislocation. On the other hand, each of the undoped AlAs electron barrier layers 4-1 and 4-2 has a sufficient height of the conduction band edge or a sufficient potential barrier height to permit a considerable low probability of tunneling of electrons through each of the electron barrier layers 4-1 and 4-2. Namely, such a sufficient height of the potential barrier or the conduction band edge of the individual AlAs electron barrier layers 4-1 and 4-2 is able to prevent electrons acting as carriers from the Schottky gate electrode to pass through the barrier layer. The energy band gap profile across the Schottky barrier structure is represented in FIG. 12. The dotted line labeled by $E_F$ represents a Fermi level. The real nine labeled by $E_C$ represents a conduction band edge profile across the Schottky contact. The Schottky barrier structure has dual potential barriers having different heights. An InAlAs layer in contact with the Schottky gate electrode constitutes a first electron barrier, while an AlAs layer in contact with the InAlAs layer constitutes a second electron barrier having a larger height than that of the first electron barrier layer. The height of the first potential barrier caused by the InAlAs layer is not so sufficient to ensure a prevention of electrons acting as carriers to flow across the Schottky contact surface from the Schottky gate electrode. By contrast, the height of the second potential barrier of the AlAs electron barrier layer is sufficient to prevent that electrons flow across the Schottky contact surface from the Schottky gate electrode and then pass through the second potential barrier. The conduction band edge discontinuity between the first InAlAs layer and the AlAs electron barrier layer permits the prevention of the electrons to pass through the Schottky barrier. This prevents a gate leakage current in which the majority carriers would be electrons.

The above dual electron barrier layers 4-1 and 4-2 made of the undoped AlAs compound semiconductors are provided not to be exposed in the recess portion or not directly to contact with the Schottky gate electrode. The second electron barrier layer 4-2 overlying the first electron barrier layer 4-1 is covered by the undoped InAlAs layer 6. The undoped InAlAs layer 6 is provided only to protect the second AlAs electron barrier layer 4-2 from suffering any damage due to the recess etching process to form the recess portion in which the Schottky gate electrode 9 is provided. Although it is preferable to provide the dual electron barrier layers 4-1 and 4-2 in the vicinity of the Schottky contact surface, the InAlAs layer 6 is necessary to protect the electron barrier layers 4-1 and 4-2 from any impact due to the recess etching process. The thickness of the InAlAs layer 6 should be sufficient to achieve a perfect protection of the second electron barrier layer 4-2 from any impact due to the recess etching process. For example, in replace of 10 nanometers thickness, 5 nanometers thickness would be acceptable for that purpose. Namely, the undoped InAlAs layer 6 is to receive all impact due to the recess etching process to form the recess portion so that the undoped AlAs barrier layer 4-2 covered and protected by the undoped InAlAs layer 6 would be free from any impact due to the recess etching process. This permits the dual AlAs electron barrier layers 4-1 and 4-2 to exhibit an excellent and sufficient ability as the electron barriers to prevent electrons to flow across the Schottky barrier from the Schottky gate. This leads to no gate leakage current of the field effect transistor and a high yield of the transistor.

As modifications, the electron barrier layers 4-1 and 4-2 may be made by other compound semiconductor materials having a sufficien potential barrier height. It was confirmed that GaAs, GaP, AlP, $In_XAl_{1-X}As$ (0<X<0.4), $Al_XGa_{1-X}As$ (0<X<1), $Al_XGa_{1-X}P$ (0<X<1), $GaAs_YP_{1-Y}$ (0<Y<1), $AlAs_{1-Y}P_Y$ (0<Y<1), $Al_XGa_{1-X}As_{1-Y}P_Y$ (0<X<1, 0<Y<1), $Al_XIn_{1-X}As_{1-Y}P_Y$ (0<X<1, 0<Y<1, 0.48<X+Y<2) are available for the electron barrier layers 4-1 and 4-2.

Figure 3:
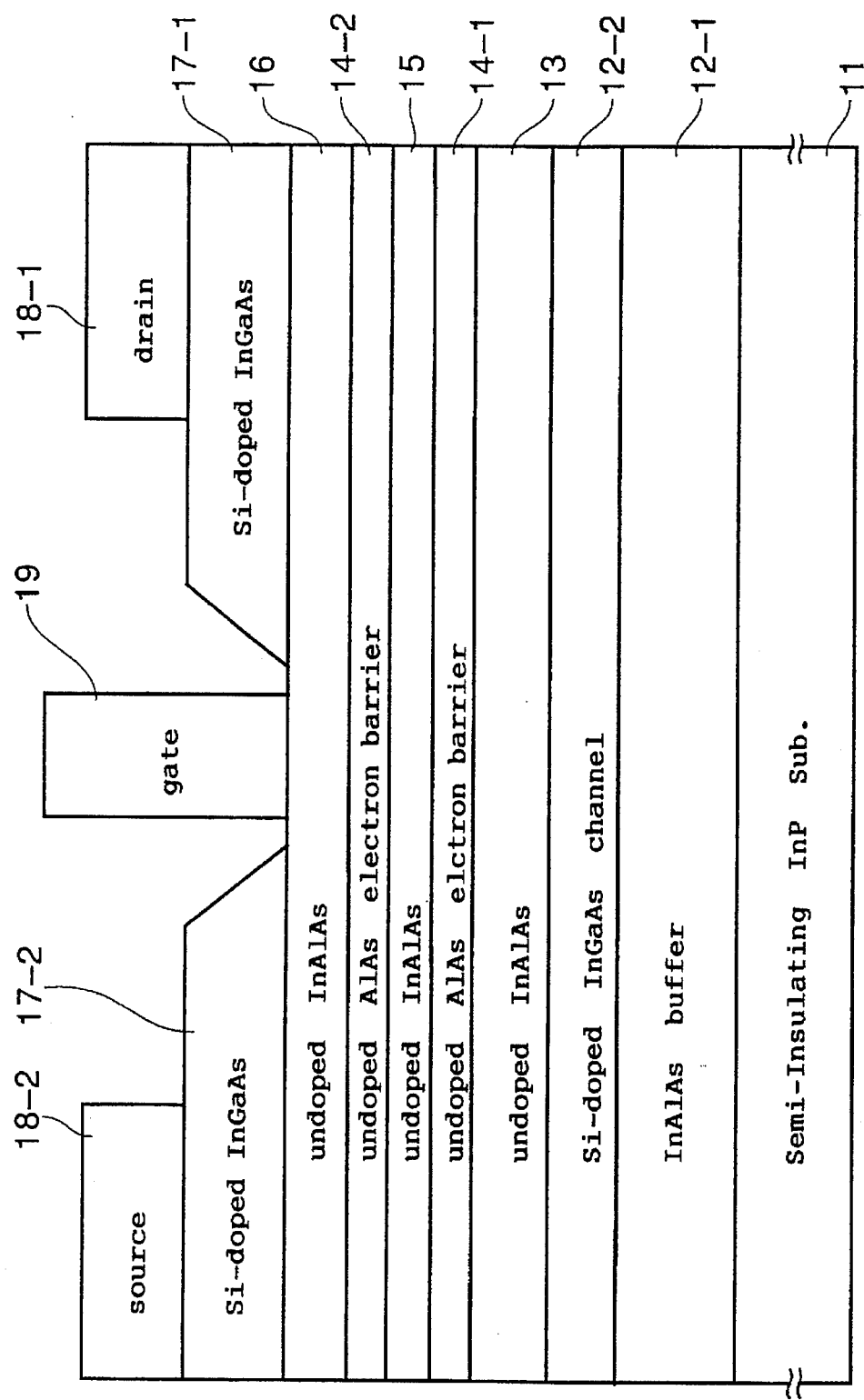
FIG. 3 is a fragmentary cross sectional elevation view illustrative of a novel high frequency and high speed field effect transistor having an improved Schottky barrier structure in a second embodiment according to the present invention.

A second embodiment according to the present invention will hereinafter be described with reference to FIG. 3 in which a novel high frequency and high speed field effect transistor having an improved Schottky gate structure is provided. A structure of the field effect transistor is illustrated in FIG. 3. The transistor has a semi-insulating InP substrate 11. An undoped InAlAs buffer layer 12-1 having a thickness of 300 nanometers is formed on the undoped semi-insulating InP substrate 11. A Si-doped InGaAs channel layer 12-2 having a thickness of 10 nanometers and an impurity concentration of 2×10$^{18}$ cm$^{-3}$ is formed on the undoped InAlAs buffer layer 12-1. An undoped InAlAs layer 13 having a thickness of 20 nanometers is formed on the Si-doped InGaAs layer 12-2. A first electron barrier layer 14-1 made of an undoped AlAs having a thickness of 5 nanometers is formed on the undoped InAlAs layer 13. An undoped InAlAs layer 15 having a thickness of 5 nanometers is formed on the first electron barrier layer 14-1. A second electron barrier layer 14-2 made of an undoped AlAs having a thickness of 5 nanometers is formed on the undoped InAlAs layer 15. An undoped InAlAs layer 16 having a thickness of 10 nanometers is formed on the second electron barrier layer 14-2. A recess etched cap layer made of a Si-doped InGaAs compound semiconductor having an impurity concentration of 6×10$^{18}$ cm$^{-3}$ constituting drain and source regions 17-1 and 17-2. Drain and source electrodes 18-1 and 18-2 are provided on the Si-doped InGaAs drain and source regions 17-1 and 17-2. The drain and source electrodes 18-1 and 18-2 may be formed by evaporations of AuGe and Ni and subsequent alloy process therefor. A Schottky gate electrode 19 is provided on an exposed surface of the undoped InAlAs layer 16 in a recess portion.

The channel layer 12-2 made of the Si-doped InGaAs compound semiconductors has a lowest conduction band edge to provide a higher electron mobility which permits the field effect transistor to exhibit high frequency and high speed performances. The Si-doped InGaAs channel layer 12-2 has such a very thin as to permit electrons serving as carriers to be confined to form a two dimensional electron gas in the Si-doped InGaAs channel layer 12-2. The Si-doped InGaAs channel layer having a very small thickness and a very high electron mobility permits the field effect transistor to possess high frequency and high speed performances.

The Si-doped InGaAs drain and source regions 17-1 and 17-2 have a high impurity concentration of $6 \times 10^{18}$ cm$^{-3}$ to form an ohmic contact with the drain and source electrodes 18-1 and 18-2 respectively. The impurity concentration of the drain and source regions may be variable to place the interface with the metal electrode in condition for a formation of ohmic contact which contributes improvements in high frequency and high speed performance of the field effect transistor.

The above field effect transistor in this embodiment has an ideal Schottky barrier structure constituting dual potential barrier having a sufficient height to prevent electrons acting as carriers to flow across the Schottky contact surface from the Schottky gate electrode 19 into the InAlAs layers or the Si-doped InGaAs channel layer 12-2. The Schottky barrier structure has dual potential barriers comprising the first and second undoped AlAs electron barrier layers 14-1 and 14-2. The first and second dual undoped AlAs electron barrier layers 14-1 and 14-2 are provided at an adjacent portion to the Schootky contact surface to ensure a prevention of electrons acting as carriers to move across the Schottky contact surface from the Schottky gate electrode 19 into the InAlAs layers and the channel layer 12-2. Each of the undoped AlAs electron barrier layers 14-1 and 14-2 has a very small thickness of 5 nanometers which is less than a critical thickness to avoid any appearance of crystal dislocation due to a lattice mismatching between AlAs and InAlAs. The above Si-doped AlAs electron barrier layers 14-1 and 14-2 are free from any problem with appearance of the crystal dislocation. On the other hand, each of the undoped AlAs electron barrier layers 14-1 and 14-2 has a sufficient height of the conduction band edge or a sufficient potential barrier height to permit a considerable low probability of tunneling of electrons through each of the electron barrier layers 14-1 and 14-2. Namely, such a sufficient height of the potential barrier or the conduction band edge of the individual AlAs electron barrier layers 14-1 and 14-2 is able to prevent electrons acting as carriers from the Schottky gate electrode to pass through the barrier layer.

The above dual electron barrier layers 14-1 and 14-2 are provided not to be exposed in the recess portion or not directly to contact with the Schottky gate electrode. The second electron barrier layer 14-2 overlying the first electron barrier layer 14-1 is covered by the undoped InAlAs layer 16. The undoped InAlAs layer 16 is provided only to protect the second AlAs electron barrier layer 14-2 from suffering any damage due to the recess etching process to form the recess portion in which the Schottky gate electrode 19 is provided. Although it is preferable to provide the dual electron barrier layers 14-1 and 14-2 in the vicinity of the Schottky contact surface, the InAlAs layer 16 is necessary to protect the electron barrier layers 14-1 and 14-2 from any impact due to the recess etching process. The thickness of the InAlAs layer 16 should be sufficient to achieve a perfect protection of the second electron barrier layer 14-2 from any impact due to the recess etching process. For example, in replace of 10 nanometers thickness, 5 nanometers thickness would be acceptable for that purpose. Namely, the undoped InAlAs layer 16 is to receive all impact due to the recess etching process to form the recess portion so that the undoped AlAs barrier layer 14-2 covered and protected by the undoped InAlAs layer 16 would be free from any impact due to the recess etching process. This permits the dual AlAs electron barrier layers 14-1 and 14-2 to exhibit an excellent and sufficient ability as the electron barriers to prevent electrons to flow across the Schottky barrier from the Schottky gate. This leads to no gate leakage current of the field effect transistor and a high yield of the transistor.

As modifications, the electron barrier layers 14-1 and 14-2 may be made by other compound semiconductor materials having a sufficien potential barrier height. It was confirmed that GaAs, GaP, AlP, $In_xAl_{1-x}As$ (0<X<0.4), $Al_xGa_{1-x}As$ (0<X<1), $Al_xGa_{1-x}P$ (0<X<1), $GaAs_yP_{1-Y}$ (0<Y<1), $AlAs_{1-y}P_y$ (0<Y<1), $Al_xGa_{1-x}As_{1-y}P_y$ (0<X<1, 0<Y<1), $Al_xIn_{1-x}As_{1-y}P_y$ (0<X<1, 0<Y<1, 0.48<X+Y<2) are available for the electron barrier layers 14-1 and 14-2.

Figure 4:
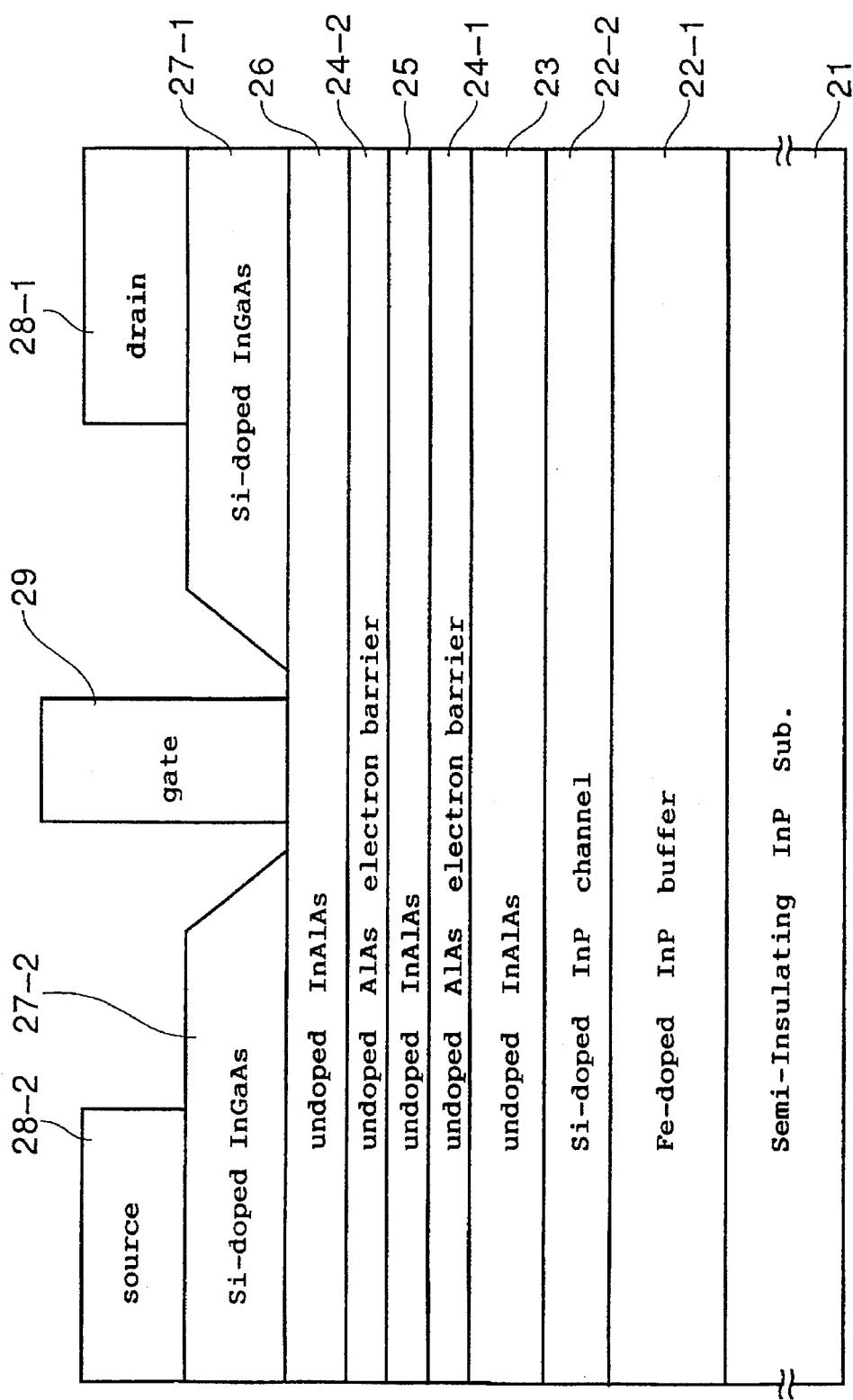
FIG. 4 is a fragmentary cross sectional elevation view illustrative of a novel high frequency and high speed field effect transistor having an improved Schottky barrier structure in a third embodiment according to the present invention.

A third embodiment according to the present invention will hereinafter be described with reference to FIG. 4 in which a novel high frequency and high speed field effect transistor having an improved Schottky gate structure is provided. A structure of the field effect transistor is illustrated in FIG. 4. The transistor has a semi-insulating InP substrate 11. A Fe-doped InP buffer layer 22-1 having a thickness of 300 nanometers and an impurity concentration of $1 \times 10^{15}$ cm$^{-3}$ is formed on the undoped semi-insulating InP substrate 21. A Si-doped InP channel layer 22-2 having a thickness of 10 nanometers and an impurity concentration of $2 \times 10^{18}$ cm$^{-3}$ is formed on the Fe-doped InP buffer layer 22-1. An undoped InAlAs layer 23 having a thickness of 20 nanometers is formed on the Si-doped InP channel layer 22-2. A first electron barrier layer 24-1 made of an undoped AlAs having a thickness of 5 nanometers is formed on the undoped InAlAs layer 23. An undoped InAlAs layer 25 having a thickness of 5 nanometers is formed on the first electron barrier layer 24-1. A second electron barrier layer 24-2 made of an undoped AlAs having a thickness of 5 nanometers is formed on the undoped InAlAs layer 25. An undoped InAlAs layer 26 having a thickness of 10 nanometers is formed on the second electron barrier layer 24-2. A recess etched cap layer made of a Si-doped InGaAs compound semiconductor having an impurity concentration of $6 \times 10^{18}$ cm$^{-3}$ constituting drain and source regions 27-1 and 27-2. Drain and source electrodes 28-1 and 28-2 are provided on the Si-doped InGaAs drain and source regions 27-1 and 27-2. The drain and source electrodes 28-1 and 28-2 may be formed by evaporations of AuGe and Ni and subsequent alloy process therefor. A Schottky gate electrode 29 is provided on an exposed surface of the undoped InAlAs layer 26 in a recess portion.

The channel layer 22-2 made of the Si-doped InP compound semiconductors has a lower conduction band edge to provide a higher electron mobility which permits the field effect transistor to exhibit high frequency and high speed performances. The Si-doped InP channel layer 22-2 has such a very thin as to permit electrons serving as carriers to be confined to form a two dimensional electron gas in the Si-doped InP channel layer 22-2. The Si-doped InP channel layer having a very small thickness and a very high electron mobility permits the field effect transistor to possess high frequency and high speed performances.

The Si-doped InGaAs drain and source regions 27-1 and 27-2 have a high impurity concentration of $6 \times 10^{18}$ cm$^{-3}$ to form an ohmic contact with the drain and source electrodes 28-1 and 28-2 respectively. The impurity concentration of the drain and source regions may be variable to place the interface with the metal electrode in condition for a formation of ohmic contact which contributes improvements in high frequency and high speed performance of the field effect transistor.

The above field effect transistor in this embodiment has an ideal Schottky barrier structure constituting dual potential barrier having a sufficient height to prevent electrons acting as carriers to flow across the Schottky contact surface from the Schottky gate electrode 29 into the InAlAs layers or the Si-doped InGaAs channel layer 22-2. The Schottky barrier structure has dual potential barriers comprising the first and second undoped AlAs electron barrier layers 24-1 and 24-2. The first and second dual undoped AlAs electron barrier layers 24-1 and 24-2 are provided at an adjacent portion to the Schootky contact surface to ensure a prevention of electrons acting as carriers to move across the Schottky contact surface from the Schottky gate electrode 29 into the InAlAs layers and the channel layer 22-2. Each of the undoped AlAs electron barrier layers 24-1 and 24-2 has a very small thickness of 5 nanometers which is less than a critical thickness to avoid any appearance of crystal dislocation due to a lattice mismatching between AlAs and InAlAs. The above Si-doped AlAs electron barrier layers 24-1 and 24-2 are free from any problem with appearance of the crystal dislocation. On the other hand, each of the undoped AlAs electron barrier layers 24-1 and 24-2 has a sufficient height of the conduction band edge or a sufficient potential barrier height to permit a considerable low probability of tunneling of electrons through each of the electron barrier layers 24-1 and 24-2. Namely, such a sufficient height of the potential barrier or the conduction band edge of the individual AlAs electron barrier layers 24-1 and 24-2 is able to prevent electrons acting as carriers from the Schottky gate electrode to pass through the barrier layer.

The above dual electron barrier layers 24-1 and 24-2 are provided not to be exposed in the recess portion or not directly to contact with the Schottky gate electrode. The second electron barrier layer 24-2 overlying the first electron barrier layer 24-1 is covered by the undoped InAlAs layer 26. The undoped InAlAs layer 26 is provided only to protect the second AlAs electron barrier layer 24-2 from suffering any damage due to the recess etching process to form the recess portion in which the Schottky gate electrode 29 is provided. Although it is preferable to provide the dual electron barrier layers 24-1 and 24-2 in the vicinity of the Schottky contact surface, the InAlAs layer 26 is necessary to protect the electron barrier layers 24-1 and 24-2 from any impact due to the recess etching process. The thickness of the InAlAs layer 26 should be sufficient to achieve a perfect protection of the second electron barrier layer 24-2 from any impact due to the recess etching process. For example, in replace of 10 nanometers thickness, 5 nanometers thickness would be acceptable for that purpose. Namely, the undoped InAlAs layer 26 is to receive all impact due to the recess etching process to form the recess portion so that the undoped AlAs barrier layer 24-2 covered and protected by the undoped InAlAs layer 26 would be free from any impact due to the recess etching process. This permits the dual AlAs electron barrier layers 24-1 and 24-2 to exhibit an excellent and sufficient ability as the electron barriers to prevent electrons to flow across the Schottky barrier from the Schottky gate. This leads to no gate leakage current of the field effect transistor and a high yield of the transistor.

As modifications, the electron barrier layers 24-1 and 24-2 may be made by other compound semiconductor materials having a sufficien potential barrier height. It was confirmed that GaAs, GaP, AlP, $In_xAl_{1-x}As$ ($0<X<0.4$), $Al_xGa_{1-x}As$ ($0<X<1$), $Al_xGa_{1-x}P$ ($0<X<1$) $GaAs_yP_{1-y}$ ($0<Y<1$) $AlAs_{1-y}P_y$ ($0<Y<1$) $Al_xGa_{1-x}As_{1-y}P_y$ ($0<X<1$, $0<Y<1$), $Al_xIn_{1-x}As_{1-y}P_y$ ($0<X<1$, $0<Y<1$, $0.48<X+Y<2$) are available for the electron barrier layers 24-1 and 24-2.

Figure 5:
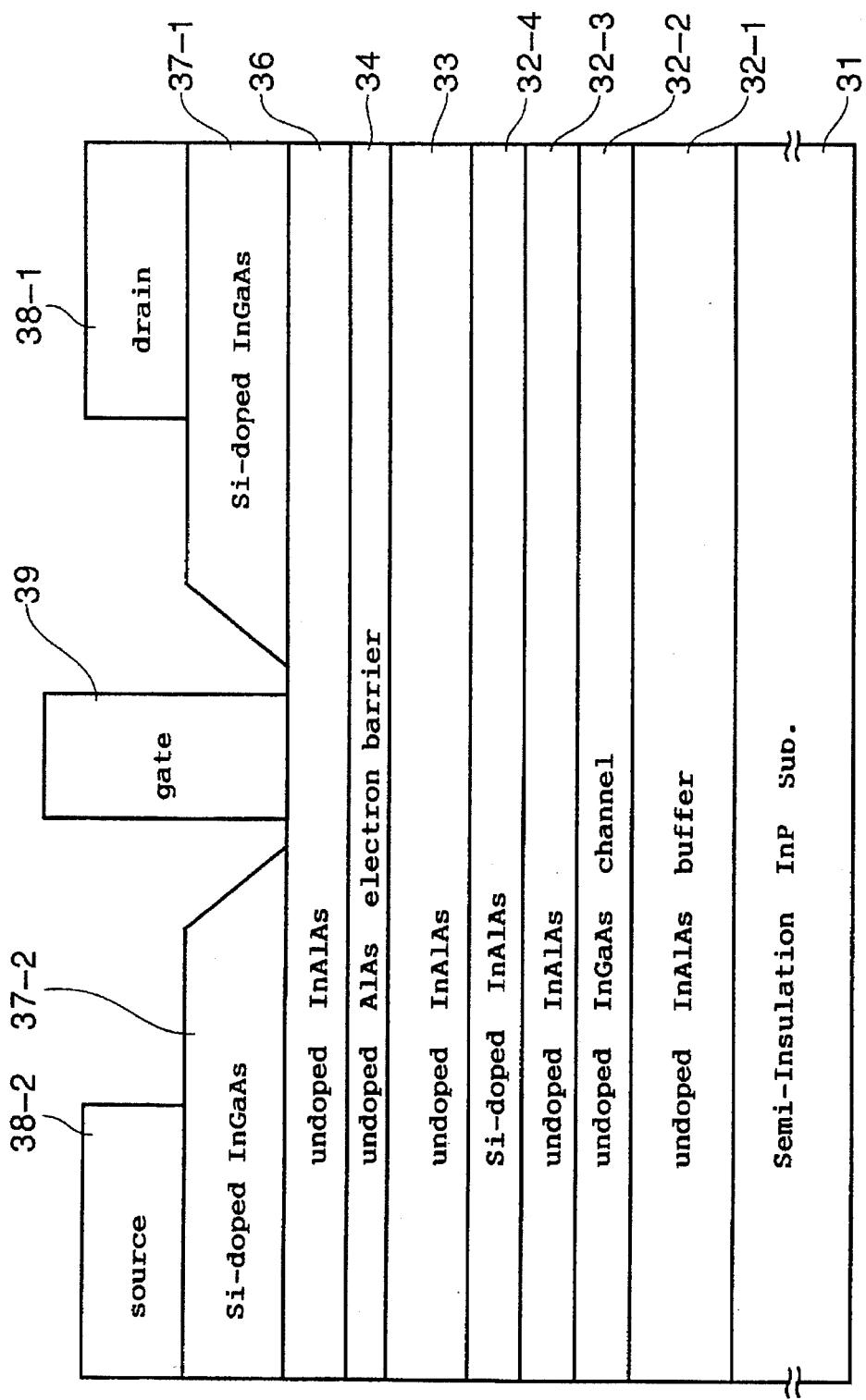
FIG. 5 is a fragmentary cross sectional elevation view illustrative of a novel high frequency and high speed field effect transistor having an improved Schottky barrier structure in a fourth embodiment according to the present invention.

A fourth embodiment according to the present invention will hereinafter be described with reference to FIG. 2 in which a novel high frequency and high speed field effect transistor having an improved Schottky gate structure is provided. A structure of the field effect transistor is illustrated in FIG. 5. The transistor has a semi-insulating InP substrate 31. An undoped InAlAs buffer layer 32-1 having a thickness of 300 nanometers is formed on the undoped semi-insulating InP substrate 31. An undoped InGaAs channel layer 32-2 having a thickness of 30 nanometers is formed on the undoped InAlAs buffer layer 32-1. An undoped InAlAs layer 32-3 having a thickness of 3 nanometers is formed on the undoped InGaAs channel layer 32-2. A Si-doped InAlAs layer 32-4 having a thickness of 10 nanometers and an impurity concentration of $5\times10^{18}$ $cm^{-3}$ is formed on the undoped InAlAs layer 32-3. An undoped InAlAs layer 33 having a thickness of 20 nanometers is formed on the Si-doped InAlAs layer 32-4. An electron barrier layer 34 made of an undoped AlAs having a thickness of 5 nanometers is formed on the undoped InAlAs layer 33. An undoped InAlAs layer 6 having a thickness of 10 nanometers is formed on the electron barrier layer 34. A recess etched cap layer made of a Si-doped InGaAs compound semiconductor having an impurity concentration of $6\times10^{18}$ $cm^{-3}$ constituting drain and source regions 37-1 and 37-2. Drain and source electrodes 38-1 and 38-2 are provided on the Si-doped InGaAs drain and source regions 37-1 and 37-2. The drain and source electrodes 38-1 and 38-2 may be formed by evaporations of AuGe and Ni and subsequent alloy process therefor. A Schottky gate electrode 39 is provided on an exposed surface of the undoped InAlAs layer 36 in a recess portion.

From the above description, the field effect transistor in this embodiment has the same structure as that of the first embodiment except for a single electron barrier layer.

The above field effect transistor in this embodiment has an ideal Schottky barrier structure constituting a single potential barrier having a sufficient height to prevent electrons acting as carriers to flow across the Schottky contact surface from the Schottky gate electrode 39 into the InAlAs layers or the undoped InGaAs channel layer 32-2. The Schottky barrier structure has a single potential barrier comprising the undoped AlAs electron barrier layer 34. The single undoped AlAs electron barrier layer 34 is provided at an adjacent portion to the Schootky contact surface to ensure a prevention of electrons acting as carriers to move across the Schottky contact surface from the Schottky gate electrode 39 into the InAlAs layers and the channel layer 32-2. The undoped AlAs electron barrier layer 34 has a very small thickness of 5 nanometers which is less than a critical thickness to avoid any appearance of crystal dislocation due to a lattice mismatching between AlAs and InAlAs. The above undoped AlAs electron barrier layers 34 is free from any problem with appearance of the crystal dislocation. On the other hand, the undoped AlAs electron barrier layer 34 has a sufficient height of the conduction band edge or a sufficient potential barrier height to permit a considerable low probability of tunneling of electrons through the electron barrier layer 34. Namely, such a sufficient height of the potential barrier or the conduction band edge of the AlAs electron barrier layer 34 is able to prevent electrons acting as carriers from the Schottky gate electrode to pass through the barrier layer.

The above single electron barrier layer 34 is provided not to be exposed in the recess portion or not directly to contact with the Schottky gate electrode. The electron barrier layer 34 is covered by the undoped InAlAs layer 36. The undoped InAlAs layer 36 is provided only to protect the AlAs electron barrier layer 34 from suffering army damage due to the recess etching process to form the recess portion in which the Schottky gate electrode 39 is provided. Although it is preferable to provide the electron barrier layer 34 in the vicinity of the Schottky contact surface, the InAlAs layer 36 is necessary to protect the electron barrier layer 34 from any impact due to the recess etching process. The thickness of the InAlAs layer 36 should be sufficient to achieve a perfect protection of the electron barrier layer 34 from any impact due to the recess etching process. For example, in replace of 10 nanometers thickness, 5 nanometers thickness would be acceptable for that purpose. Namely, the undoped InAlAs layer 36 is to receive all impact due to the recess etching process to form the recess portion so that the undoped AlAs barrier layer 34 covered and protected by the undoped InAlAs layer 36 would be free from any impact due to the recess etching process. This permits the AlAs electron barrier layer 34 to exhibit an excellent and sufficient ability as the electron barriers to prevent electrons to flow across the Schottky barrier from the Schottky gate. This leads to no gate leakage current of the field effect transistor and a high yield of the transistor.

As modifications, the electron barrier layer 34 may be made by other compound semiconductor materials having a sufficien potential barrier height. It was confirmed that GaAs, GaP, AlP, $In_xAl_{1-x}As$ (0<X<0.4), $Al_xGa_{1-x}As$ (0<X<1), $Al_xGa_{1-x}P$ (0<X<1), $GaAs_yP_{1-y}$ (0<Y<1), $AlAs_{1-y}P_y$ (0<Y<1), $Al_xGa_{1-x}As_{1-y}P_y$ (0<X<1, 0<Y<1), $Al_xIn_{1-x}As_{1-y}P_y$ (0<X<1, 0<Y<1, 0.48<X+Y<2) are available for the electron barrier layers 34.

Figure 6:
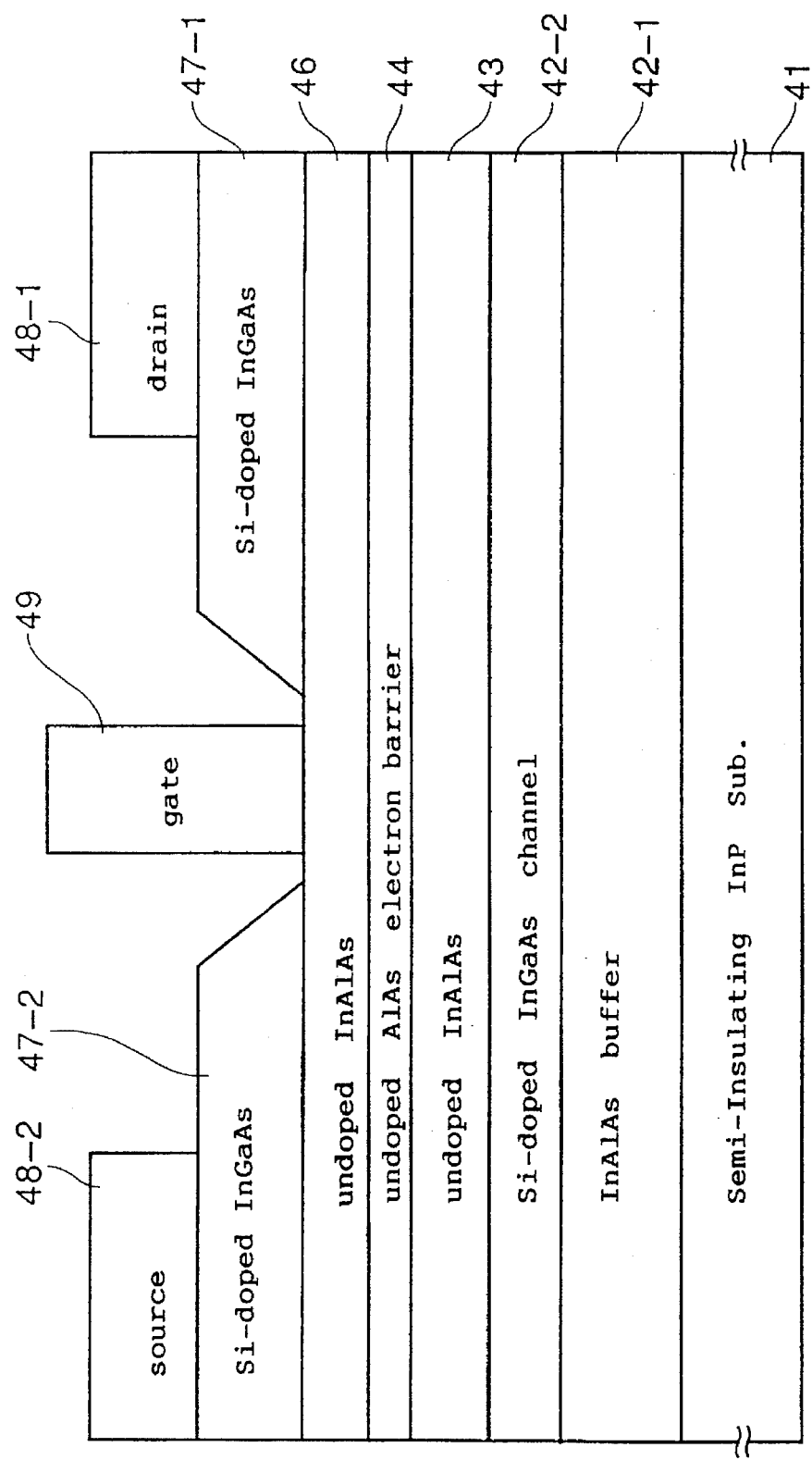
FIG. 6 is a fragmentary cross sectional elevation view illustrative of a novel high frequency and high speed field effect transistor having an improved Schottky barrier structure in a fifth embodiment according to the present invention.

A fifth embodiment according to the present invention will hereinafter be described with reference to FIG. 6 in which a novel high frequency and high speed field effect transistor having an improved Schottky gate structure is provided. A structure of the field effect transistor is illustrated in FIG. 6. The transistor has a semi-insulating InP substrate 41. An undoped InAlAs buffer layer 42-1 having a thickness of 300 nanometers is formed on the undoped semi-insulating InP substrate 41. A Si-doped InGaAs channel layer 42-2 having a thickness of 10 nanometers and an impurity concentration of $2\times10^{18}$ cm$^{-3}$ is formed on the undoped InAlAs buffer layer 42-1. An undoped InAlAs layer 43 having a thickness of 20 nanometers is formed on the Si-doped InGaAs layer 42-2. An electron barrier layer 44 made of an undoped AlAs having a thickness of 5 nanometers is formed on the undoped InAlAs layer 43. An undoped InAlAs layer 46 having a thickness of 10 nanometers is formed on the electron barrier layer 44. A recess etched cap layer made of a Si-doped InGaAs compound semiconductor having an impurity concentration of $6\times10^{18}$ cm$^{-3}$ constituting drain and source regions 47-1 and 47-2. Drain and source electrodes 48-1 and 48-2 are provided on the Si-doped InGaAs drain and source regions 47-1 and 47-2. The drain and source electrodes 48-1 and 48-2 may be formed by evaporations of AuGe and Ni and subsequent alloy process therefor. A Schottky gate electrode 49 is provided on an exposed surface of the undoped InAlAs layer 46 in a recess portion.

The field effect transistor in this embodiment has the same structure as that of the second embodiment except for a single electron barrier.

The above field effect transistor in this embodiment has an ideal Schottky barrier structure constituting a single potential barrier having a sufficient height to prevent electrons acting as carriers to flow across the Schottky contact surface from the Schottky gate electrode 49 into the InAlAs layers or the Si-doped InGaAs channel layer 42-2. The Schottky barrier structure has dual potential barriers comprising the undoped AlAs electron barrier layer 44. The single undoped AlAs electron barrier layer 44 is provided at an adjacent portion to the Schootky contact surface to ensure a prevention of electrons acting as carriers to move across the Schottky contact surface from the Schottky gate electrode 49 into the InAlAs layer and the channel layer 42-2. The undoped AlAs electron barrier layer 44 has a very small thickness of 5 nanometers which is less than a critical thickness to avoid any appearance of crystal dislocation due to a lattice mismatching between AlAs and InAlAs. The above undoped AlAs electron barrier layer 44 is free from any problem with appearance of the crystal dislocation. On the other hand, the undoped AlAs electron barrier layer 44 has a sufficient height of the conduction band edge or a sufficient potential barrier height to permit a considerable low probability of tunneling of electrons through the electron barrier layer 44. Namely, such a sufficient height of the potential barrier or the conduction band edge of the individual AlAs electron barrier layer 44 is able to prevent electrons acting as carriers from the Schottky gate electrode to pass through the barrier layer.

The above single electron barrier layer 44 is provided not to be exposed in the recess portion or not directly to contact with the Schottky gate electrode. The electron barrier layer 44 is covered by the undoped InAlAs layer 46. The undoped InAlAs layer 46 is provided only to protect the AlAs electron barrier layer 44 from suffering any damage due to the recess etching process to form the recess portion in which the Schottky gate electrode 49 is provided. Although it is preferable to provide the single electron barrier layer 44 in the vicinity of the Schottky contact surface, the InAlAs layer 46 is necessary to protect the electron barrier layers 44 from any impact due to the recess etching process. The thickness of the InAlAs layer 46 should be sufficient to achieve a perfect protection of the electron barrier layer 44 from any impact due to the recess etching process. For example, in replace of 10 nanometers thickness, 5 nanometers thickness would be acceptable for that purpose. Namely, the undoped InAlAs layer 46 is to receive all impact due to the recess etching process to form the recess portion so that the undoped AlAs barrier layer 44 covered and protected by the undoped InAlAs layer 46 would be free from any impact due to the recess etching process. This permits the dual AlAs electron barrier layers 44 to exhibit an excellent and sufficient ability as the electron barriers to prevent electrons to flow across the Schottky barrier from the Schottky gate. This leads to no gate leakage current of the field effect transistor and a high yield of the transistor.

As modifications, the electron barrier layer 44 may be made by other compound semiconductor materials having a sufficien potential barrier height. It was confirmed that GaAs, GaP, AlP, $In_xAl_{1-x}As$ (0<X<0.4), $Al_xGa_{1-x}As$ (0<X<1), $Al_xGa_{1-x}P$ (0<X<1), $GaAs_yP_y$ (0<Y<1), $AlAs_{1-y}P_y$ (0<Y<1), $Al_xGa_{1-x}As_{1-y}P_y$ (0<X<1, 0<Y<1), $Al_xIn_{1-x}As_{1-y}P_y$ (0<X<1, 0<Y<1, 0.48<X+Y<2) are available for the electron barrier layer 44.

Figure 7:
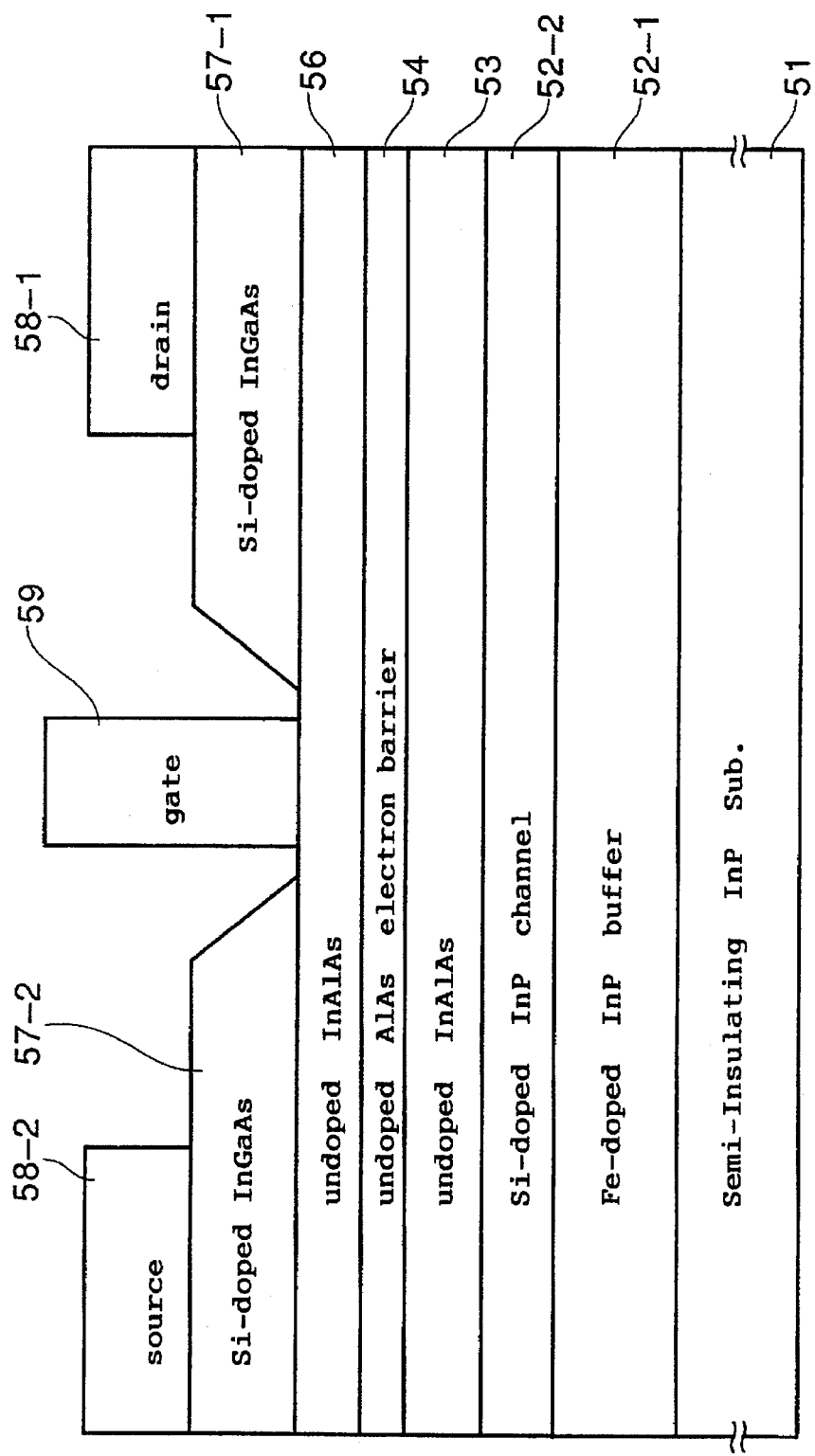
FIG. 7 is a fragmentary cross sectional elevation view illustrative of a novel high frequency and high speed field effect transistor having an improved Schottky barrier structure in a sixth embodiment according to the present invention.

A sixth embodiment according to the present invention will hereinafter be described with reference to FIG. 7 in which a novel high frequency and high speed field effect transistor having an improved Schottky gate structure is provided. A structure of the field effect transistor is illustrated in FIG. 7. The transistor has a semi-insulating InP substrate 51. A Fe-doped InP buffer layer 52-1 having a thickness of 300 nanometers and an impurity concentration of $1\times10^{15}$ cm$^{-3}$ is formed on the undoped semi-insulating InP substrate 51. A Si-doped InP channel layer 52-2 having a thickness of 10 nanometers and an impurity concentration of $2\times10^{18}$ cm$^{-3}$ is formed on the Fe-doped InP buffer layer 52-1. An undoped InAlAs layer 53 having a thickness of 20 nanometers is formed on the Si-doped InP channel layer 52-2. An electron barrier layer 54 made of an undoped AlAs having a thickness of 5 nanometers is formed on the undoped InAlAs layer 53. An undoped InAlAs layer 56 having a thickness of 10 nanometers is formed on the electron barrier layer 54. A recess etched cap layer made of a Si-doped InGaAs compound semiconductor having an impurity concentration of $6\times10^{18}$ cm$^{-3}$ constituting drain and source regions 57-1 and 57-2. Drain and source electrodes 58-1 and 58-2 are provided on the Si-doped InGaAs drain and source regions 57-1 and 57-2. The drain and source electrodes 58-1 and 58-2 may be formed by evaporations of AuGe and Ni and subsequent alloy process therefor. A Schottky gate electrode 59 is provided on an exposed surface of the undoped InAlAs layer 56 in a recess portion.

From the above description, the field effect transistor in this embodiment has the same structure as that of the second embodiment except for a single electron barrier layer.

The above field effect transistor in this embodiment has an ideal Schottky barrier structure constituting dual potential barrier having a sufficient height to prevent electrons acting as carriers to flow across the Schottky contact surface from the Schottky gate electrode 59 into the InAlAs layers or the Si-doped InGaAs channel layer 52-2. The Schottky barrier structure has a single potential barrier comprising the undoped AlAs electron barrier layer 54. The undoped AlAs electron barrier layers 54 is provided at an adjacent portion to the Schootky contact surface to ensure a prevention of electrons acting as carriers to move across the Schottky contact surface from the Schottky gate electrode 59 into the InAlAs layers and the channel layer 52-2. The undoped AlAs electron barrier layer 54 has a very small thickness of 5 nanometers which is less than a critical thickness to avoid any appearance of crystal dislocation due to a lattice mismatching between AlAs and InAlAs. The above undoped AlAs electron barrier layer 54 is free from any problem with appearance of the crystal dislocation. On the other hand, the undoped AlAs electron barrier layer 54 has a sufficient height of the conduction band edge or a sufficient potential barrier height to permit a considerable low probability of tunneling of electrons through the electron barrier layers 54. Namely, such a sufficient height of the potential barrier or the conduction band edge of the individual AlAs electron barrier layers 54 is able to prevent electrons acting as carriers from the Schottky gate electrode to pass through the barrier layer.

The above single electrode barrier layer 54 is provided not to be exposed in the recess portion or not directly to contact with the Schottky gate electrode. The electron barrier layer 54 is covered by the undoped InAlAs layer 56. The undoped InAlAs layer 56 is provided only to protect the AlAs electron barrier layer 54 from suffering any damage due to the recess etching process to form the recess portion in which the Schottky gate electrode 59 is provided. Although it is preferable to provide the dual electron barrier layer 54 in the vicinity of the Schottky contact surface, the InAlAs layer 56 is necessary to protect the electron barrier layers 54 from any impact due to the recess etching process. The thickness of the InAlAs layer 56 should be sufficient to achieve a perfect protection of the electron barrier layer 54 from any impact due to the recess etching process. For example, in replace of 10 nanometers thickness, 5 nanometers thickness would be acceptable for that purpose. Namely, the undoped InAlAs layer 56 is to receive all impact due to the recess etching process to form the recess portion so that the undoped AlAs barrier layer 54 covered and protected by the undoped InAlAs layer 56 would be free from any impact due to the recess etching process. This permits the dual AlAs electron barrier layer 54 to exhibit an excellent and sufficient ability as the electron barriers to prevent electrons to flow across the Schottky barrier from the Schottky gate. This leads to no gate leakage current of the field effect transistor and a high yield of the transistor.

As modifications, the electron barrier layer 54 may be made by other compound semiconductor materials having a sufficien potential barrier height. It was confirmed that GaAs, GaP, AlP, $In_xAl_{1-x}As$ (0<X<0.4), $Al_xGa_{1-x}As$ (0<X<1), $Al_xGa_{1-x}P$ (0<X<1), $GaAs_yP_{1-y}$ (0<Y<1), $AlAs_{1-y}P_y$ (0<Y<1), $Al_xGa_{1-x}As_{1-y}P_y$ (0<X<1, 0<Y<1), $Al_xIn_{1-x}As_{1-y}P_y$ (0<X<1, 0<X<1, 0<Y<1, 0.48<X+Y<2) are available for the electron barrier layer 54.

Figure 8:
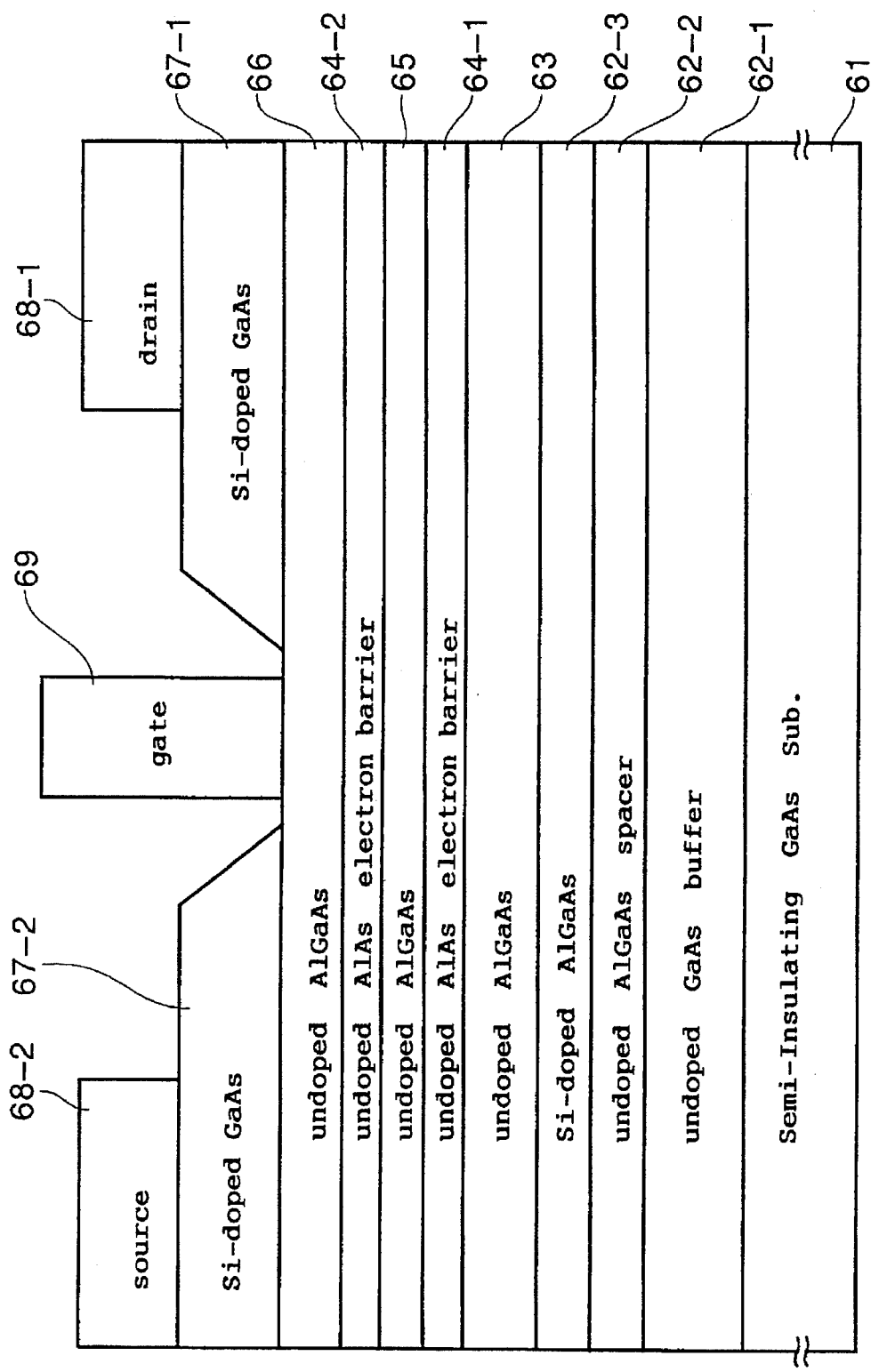
FIG. 8 is a fragmentary cross sectional elevation view illustrative of a novel high frequency and high speed field effect transistor having an improved Schottky barrier structure in a seventh embodiment according to the present invention.

A seventh embodiment according to the present invention will hereinafter be described with reference to FIG. 8 in which a novel high frequency and high speed field effect transistor having an improved Schottky gate structure is provided. A structure of the field effect transistor is illustrated in FIG. 8. The transistor has a semi-insulating GaAs substrate 61. An undoped GaAs buffer layer 62-1 having a thickness of 400 nanometers is formed on the undoped semi-insulating GaAs substrate 61. An undoped $Al_{0.2}Ga_{0.8}As$ spacer layer 62-2 having a thickness of 3 nanometers is formed on the undoped GaAs buffer layer 62-1. A Si-doped AlGaAs channel layer 62-3 having a thickness of 40 nanometers and an impurity concentration of $2\times10^{18}$ cm$^{-3}$ is formed on the undoped AlGaAs spacer layer 62-2. An undoped AlGaAs layer 63 having a thickness of 20 nanometers is formed on the Si-doped AlGaAs channel layer 62-2. A first electron barrier layer 64-1 made of an undoped AlAs having a thickness of 5 nanometers is formed on the undoped AlGaAs layer 63. An undoped AlGaAs layer having a thickness of 5 nanometers 65 is formed on the first electron barrier 64-1. A second electron barrier layer 64-2 made of an undoped AlAs having a thickness of 5 nanometers is formed on the undoped AlGaAs layer 65. An undoped AlGaAs layer 66 having a thickness of 10 nanometers is formed on the second electron barrier layer 64-2. A recess etched cap layer made of a Si-doped GaAs compound semiconductor having an impurity concentration of $6\times10^{18}$ cm$^{-3}$ constituting drain and source regions 67-1 and 67-2. Drain and source electrodes 68-1 and 68-2 are provided on the Si-doped GaAs drain and source regions 67-1 and 67-2. The drain and source electrodes 68-1 and 68-2 may be formed by evaporations of AuGe and Ni and subsequent alloy process therefor. A Schottky gate electrode 69 is provided on an exposed surface of the undoped AlGaAs layer 66 in a recess portion.

The above field effect transistor in this embodiment has an ideal Schottky barrier structure constituting dual potential barriers having a sufficient height to prevent electrons acting as carriers to flow across the Schottky contact surface from the Schottky gate electrode 69 into the AlGaAs layers or the undoped AlGaAs channel layer 62-3. The Schottky barrier structure has dual potential barriers comprising the undoped AlAs electron barrier layers 64-1 and 64-2. The dual undoped AlAs electron barrier layer 64-1 and 64-2 are provided at an adjacent portion to the Schootky contact surface to ensure a prevention of electrons acting as carriers to move across the Schottky contact surface from the Schottky gate electrode 69 into the AlGaAs layers and the channel layer 62-3. Each of the undoped AlAs electron barrier layers 64-1 and 64-2 has a very small thickness of 5 nanometers which is less than a critical thickness to avoid any appearance of crystal dislocation due to a lattice mismatching between AlAs and AlGaAs. The above undoped AlAs electron barrier layers 64-1 and 64-2 are free from any problem with appearance of the crystal dislocation. On the other hand, the undoped AlAs electron barrier layers 64-1 and 64-2 have a sufficient height of the conduction band edge or a sufficient potential barrier height to permit a considerable low probability of tunneling of electrons through the electron barrier layer 64. Namely, such a sufficient height of the potential barrier or the conduction band edge of the AlAs electron barrier layers 64-1 and 64-2 is able to prevent electrons acting as carriers from the Schottky gate electrode to pass through the barrier layer.

The above dual electron barrier layer 64-1 and 64-2 are provided not to be exposed in the recess portion or not directly to contact with the Schottky gate electrode. The electron barrier layer 64 is covered by the undoped AlGaAs layer 66. The undoped AlGaAs layer 66 is provided only to protect the second AlAs electron barrier layer 64-2 from suffering any damage due to the recess etching process to form the recess portion in which the Schottky gate electrode 69 is provided. Although it is preferable to provide the electron barrier layers 64-1 and 64-2 in the vicinity of the Schottky contact surface, the AlGaAs layer 66 is necessary to protect the electron barrier layers 64-1 and 64-2 from any impact due to the recess etching process. The thickness of the AlGaAs layer 66 should be sufficient to achieve a perfect protection of the electron barrier layer 64 from any impact due to the recess etching process. For example, in replace of 10 nanometers thickness, 5 nanometers thickness would be acceptable for that purpose. Namely, the undoped AlGaAs layer 66 is to receive all impact due to the recess etching process to form the recess portion so that the second undoped AlAs barrier layer 64-2 covered and protected by the undoped AlGaAs layer 66 would be free from any impact due to the recess etching process. This permits the AlAs electron barrier layers 64-1 and 64-2 to exhibit an excellent and sufficient ability as the electron barriers to prevent electrons to flow across the Schottky barrier from the Schottky gate. This leads to no gate leakage current of the field effect transistor and a high yield of the transistor.

As modifications, the electron barrier layer 64 may be made by other compound semiconductor materials having a sufficien potential barrier height. It was confirmed that GaP, AlP $Al_xGa_{1-x}P$ ($0<X<1$) $GaAs_YP_{1-Y}$ ($0<Y<1$), $AlAs_{1-Y}P_Y$ ($0<Y<1$), $Al_xGa_{1-x}As_{1-Y}P_Y$ ($0<X<1$, $0<Y<1$), $Al_xIn_{1-x}As_{1-Y}P_Y$ ($0<X<1$, $0<Y<1$, $0.48<X+Y<2$) are available for the electron barrier layers 64-1 end 64-2.

Figure 9:
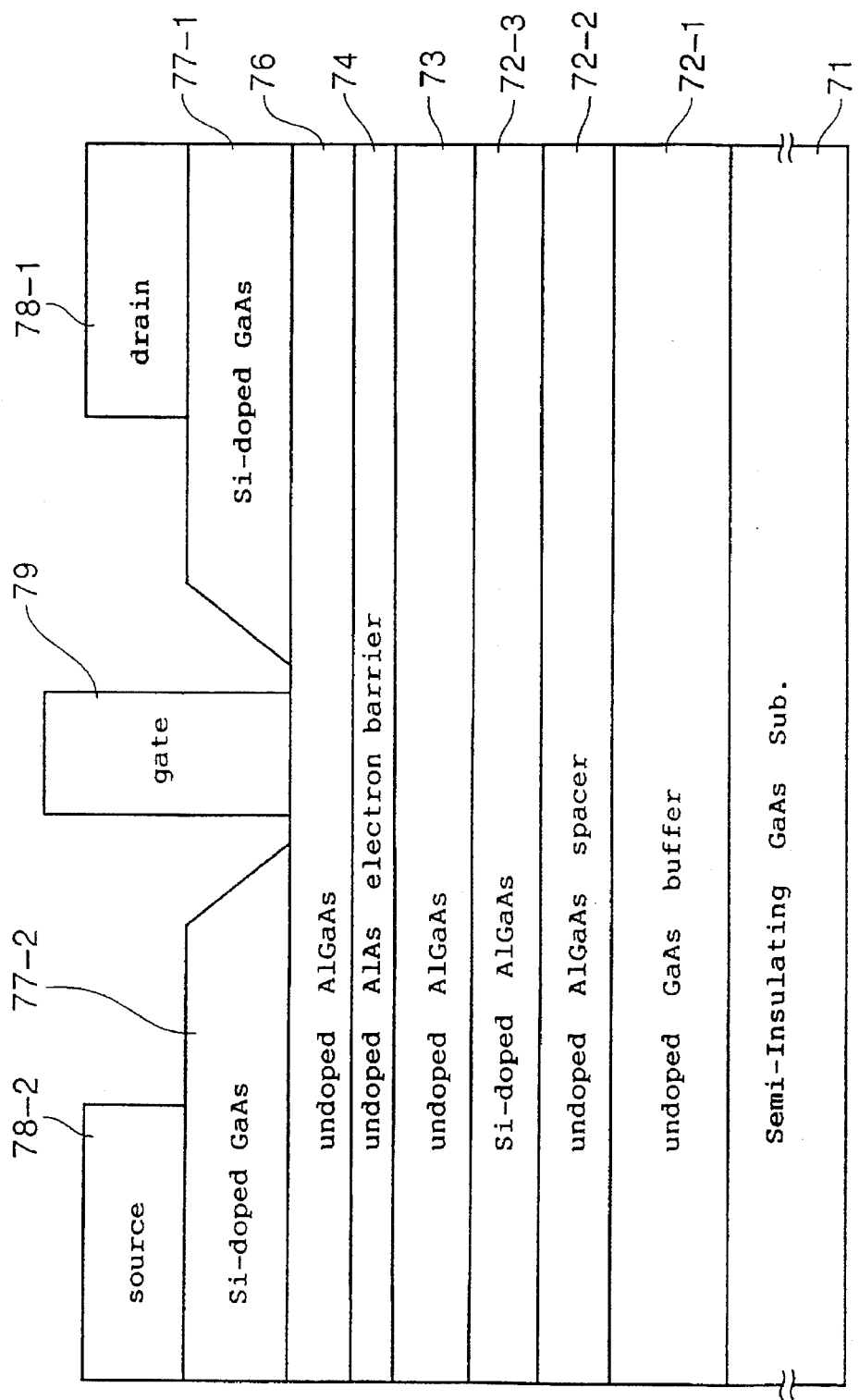
FIG. 9 is a fragmentary cross sectional elevation view illustrative of a novel high frequency and high speed field effect transistor having an improved Schottky barrier structure in an eighth embodiment according to the present invention.

An eight embodiment according to the present invention will hereinafter be described with reference to FIG. 9 in which a novel high frequency and high speed field effect transistor having an improved Schottky gate structure is provided. A structure of the field effect transistor is illustrated in FIG. 9. The transistor has a semi-insulating GaAs substrate 71. An undoped GaAs buffer layer 72-1 having a thickness of 400 nanometers is formed on the undoped semi-insulating GaAs substrate 71. An undoped $Al_{0.2}Ga_{0.8}As$ spacer layer 72-2 having a thickness of 3 nanometers is formed on the undoped GaAs buffer layer 72-1. A Si-doped AlGaAs channel layer 72-3 having a thickness of 40 nanometers and an impurity concentration of $2\times10^{18}$ $cm^{-3}$ is formed on the undoped AlGaAs spacer layer 72-2. An undoped AlGaAs layer 73 having a thickness of 20 nanometers is formed on the Si-doped AlGaAs channel layer 72-2. A single electron barrier layer 74 made of an undoped AlAs having a thickness of 5 nanometers is formed on the undoped AlGaAs layer 73. An undoped AlGaAs layer 66 having a thickness of 10 nanometers is formed on the electron barrier layer 74. A recess etched cap layer made of a Si-doped GaAs compound semiconductor having an impurity concentration of $6\times10^{18}$ $cm^{-3}$ constituting drain and source regions 77-1 and 77-2. Drain and source electrodes 78-1 and 78-2 are provided on the Si-doped GaAs drain and source regions 77-1 and 77-2. The drain and source electrodes 78-1 and 78-2 may be formed by evaporations of AuGe and Ni and subsequent alloy process therefor. A Schottky gate electrode 79 is provided on an exposed surface of the undoped AlGaAs layer 76 in a recess portion.

The above field effect transistor in this embodiment has an ideal Schottky barrier structure constituting a single potential barriers having a sufficient height to prevent electrons acting as carriers to flow across the Schottky contact surface from the Schottky gate electrode 79 into the AlGaAs layers or the undoped AlGaAs channel layer 72-3. The Schottky barrier structure has a single potential barrier comprising the undoped AlAs electron barrier layers 74. The dual undoped AlAs electron barrier layer 74 is provided at an adjacent portion to the Schootky contact surface to ensure a prevention of electrons acting as carriers to move across the Schottky contact surface from the Schottky gate electrode 79 into the AlGaAs layers and the channel layer 72-3. The undoped AlAs electron barrier layer 74 has a very small thickness of 5 nanometers which is less than a critical thickness to avoid any appearance of crystal dislocation due to a lattice mismatching between AlAs and AlGaAs. The above undoped AlAs electron barrier layer 74 is free from any problem with appearance of the crystal dislocation. On the other hand, the undoped AlAs electron barrier layer 74 has a sufficient height of the conduction band edge or a sufficient potential barrier height to permit a considerable low probability of tunneling of electrons through the electron barrier layer 74. Namely, such a sufficient height of the potential barrier or the conduction band edge of the AlAs electron barrier layer 74 is able to prevent electrons acting as carriers from the Schottky gate electrode to pass through the barrier layer.

The above single electron barrier layer 74 is provided not to be exposed in the recess portion or not directly to contact with the Schottky gate electrode. The electron barrier layer 74 is covered by the undoped AlGaAs layer 76. The undoped AlGaAs layer 76 is provided only to protect the AlAs electron barrier layer 74 from suffering any damage due to the recess etching process to form the recess portion in which the Schottky gate electrode 79 is provided. Although it is preferable to provide the electron barrier layer 74 in the vicinity of the Schottky contact surface, the AlGaAs layer 76 is necessary to protect the electron barrier layer 74 from any impact due to the recess etching process. The thickness of the AlGaAs layer 76 should be sufficient to achieve a perfect protection of the electron barrier layer 74 from any impact due to the recess etching process. For example, in replace of 10 nanometers thickness, 5 nanometers thickness would be acceptable for that purpose. Namely, the undoped AlGaAs layer 76 is ho receive all impact due to the recess etching process to form the recess portion so that the second undoped AlAs barrier layer 74 covered and protected by the undoped AlGaAs layer 76 would be free from any impact due to the recess etching process. This permits the AlAs electron barrier layer 74 to exhibit an excellent and sufficient ability as the electron barriers to prevent electrons to flow across the Schottky barrier from the Schottky gate. This leads to no gate leakage current of the field effect transistor and a high yield of the transistor.

As modifications, the electron barrier layer 74 may be made by other compound semiconductor materials having a sufficien potential barrier height. It was confirmed that GaP, AlP, $Al_xGa_{1-x}P$ (0<X<1), $GaAs_yP_{1-Y}$ (0<Y<1), $AlAs_{1-Y}P_Y$ (0<Y<1), $Al_xGa_{1-X}As_{1-Y}P_Y$ (0<X<1, 0<Y<1), $Al_xIn_{1-x}As_{1-Y}P_Y$ (0<X<1, 0<Y<1, 0.48<X+Y<2) are available for the electron barrier layer 74.

Figure 10:
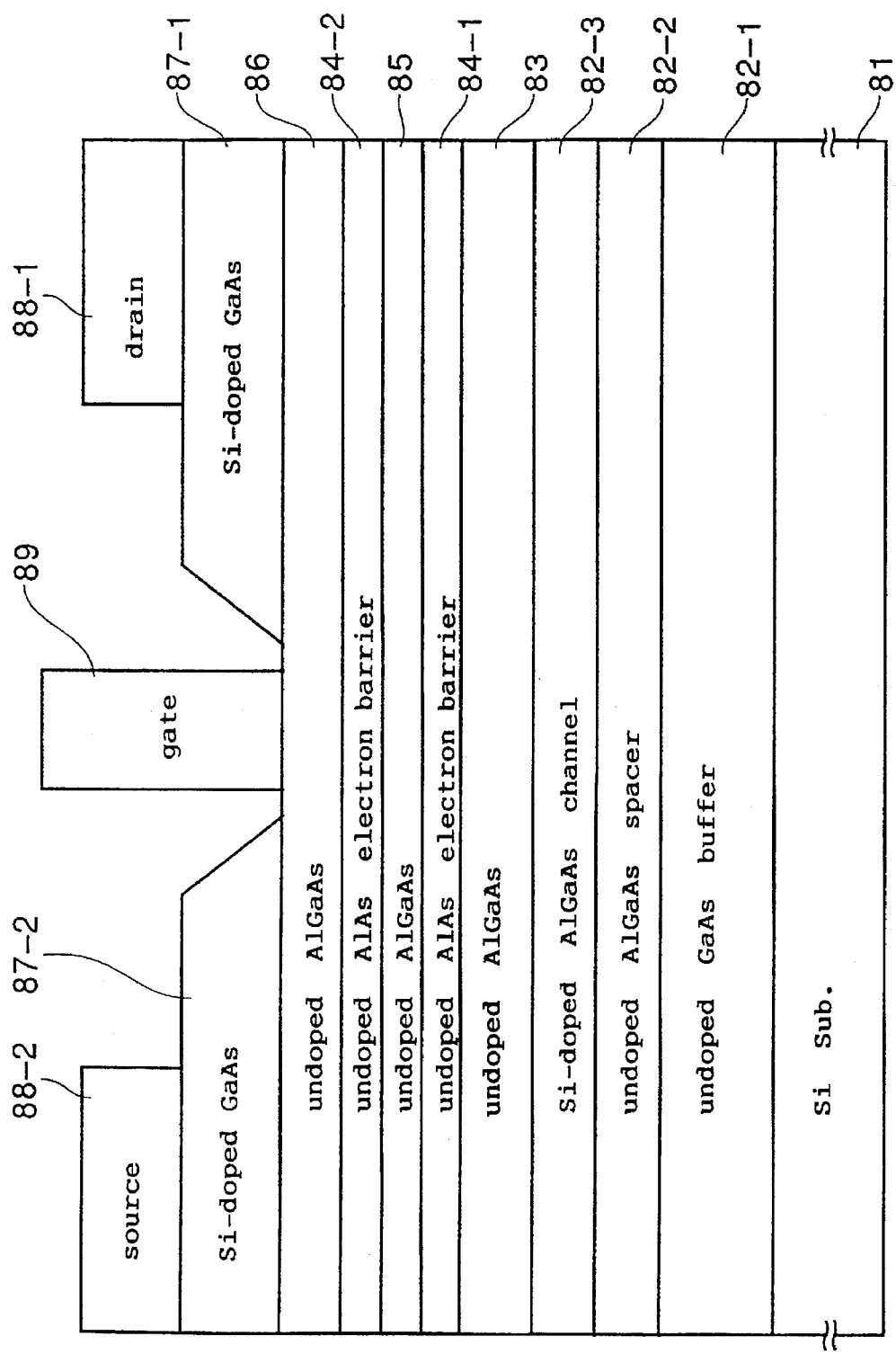
FIG. 10 is a fragmentary cross sectional elevation view illustrative of a novel high frequency and high speed field effect transistor having an improved Schottky barrier structure in a ninth embodiment according to the present invention.

A ninth embodiment according to the present invention will hereinafter be described with reference to FIG. 10 in which a novel high frequency and high speed field effect transistor having an improved Schottky gate structure is provided. A structure of the field effect transistor is illustrated in FIG. 10. The transistor has a silicon substrate 81. An undoped GaAs buffer layer 82-1 having a thickness of 800 nanometers is formed on the silicon substrate 81. An undoped $Al_{0.2}Ga_{0.8}As$ spacer layer 82-2 having a thickness of 3 nanometers is formed on the undoped GaAs buffer layer 82-1. A Si-doped AlGaAs channel layer 82-3 having a thickness of 40 nanometers and an impurity concentration of $2\times10^{18}$ cm$^{-3}$ is formed on the undoped AlGaAs spacer layer 82-2. An undoped AlGaAs layer 83 having a thickness of 20 nanometers is formed on the Si-doped AlGaAs channel layer 82-2. A first electron barrier layer 84-1 made of an undoped AlAs having a thickness of 5 nanometers is formed on the undoped AlGaAs layer 83. An undoped AlGaAs layer having a thickness of 5 nanometers 85 is formed on the first electron barrier 84-1. A second electron barrier layer 84-2 made of an undoped AlAs having a thickness of 5 nanometers is formed on the undoped AlGaAs layer 85. An undoped AlGaAs layer 66 having a thickness of 10 nanometers is formed on the second electron barrier layer 84-2. A recess etched cap layer made of a Si-doped GaAs compound semiconductor having an impurity concentration of $6\times10^{18}$ cm$^{-3}$ constituting drain and source regions 87-1 and 87-2. Drain and source electrodes 88-1 and 88-2 are provided on the Si-doped GaAs drain and source regions 87-1 and 87-2. The drain and source electrodes 88-1 and 88-2 may be formed by evaporations of AuGe and Ni and subsequent alloy process therefor. A Schottky gate electrode 89 is provided on an exposed surface of the undoped AlGaAs layer 86 in a recess portion.

The above field effect transistor in this embodiment has an ideal Schottky barrier structure constituting dual potential barriers having a sufficient height to prevent electrons acting as carriers to flow across the Schottky contact surface from the Schottky gate electrode 89 into the AlGaAs layers or the undoped AlGaAs channel layer 82-3. The Schottky barrier structure has dual potential barriers comprising the undoped AlAs electron barrier layers 84-1 and 84-2. The dual undoped AlAs electron barrier layer 84-1 and 84-2 are provided at an adjacent portion to the Schootky contact surface to ensure a prevention of electrons acting as carriers to move across the Schottky contact surface from the Schottky gate electrode 89 into the AlGaAs layers and the channel layer 82-3. Each of the undoped AlAs electron barrier layers 84-1 and 84-2 has a very small thickness of 5 nanometers which is less than a critical thickness to avoid any appearance of crystal dislocation due to a lattice mismatching between AlAs and AlGaAs. The above undoped AlAs electron barrier layers 84-1 and 84-2 are free from any problem with appearance of the crystal dislocation. On the other hand, the undoped AlAs electron barrier layers 84-1 and 84-2 have a sufficient height of the conduction band edge or a sufficient potential barrier height to permit a considerable low probability of tunneling of electrons through the electron barrier layer 84. Namely, such a sufficient height of the potential barrier or the conduction band edge of the AlAs electron barrier layers 84-1 and 84-2 is able to prevent electrons acting as carriers from the Schottky gate electrode to pass through the barrier layer.

The above dual electron barrier layers 84-1 and 84-2 are provided not to be exposed in the recess portion or not directly to contact with the Schottky gate electrode. The electron barrier layer 84 is covered by the undoped AlGaAs layer 86. The undoped AlGaAs layer 86 is provided only to protect the second AlAs electron barrier layer 84-2 from suffering any damage due to the recess etching process to form the recess portion in which the Schottky gate electrode 89 is provided. Although it is preferable to provide the electron barrier layers 84-1 and 84-2 in the vicinity of the Schottky contact surface, the AlGaAs layer 86 is necessary to protect the electron barrier layers 84-1 and 84-2 from any impact due to the recess etching process. The thickness of the AlGaAs layer 86 should be sufficient to achieve a perfect protection of the electron barrier layer 84 from any impact due to the recess etching process. For example, in replace of 10 nanometers thickness, 5 nanometers thickness would be acceptable for that purpose. Namely, the undoped AlGaAs layer 86 is to receive all impact due to the recess etching process to form the recess portion so that the second undoped AlAs barrier layer 84-2 covered and protected by the undoped AlGaAs layer 86 would be free from any impact due to the recess etching process. This permits the AlAs electron barrier layers 84-1 and 84-2 to exhibit an excellent and sufficient ability as the electron barriers to prevent electrons to flow across the Schottky barrier from the Schottky gate. This leads to no gate leakage current of the field effect transistor and a high yield of the transistor.

As modifications, the electron barrier layer 84 may be made by other compound semiconductor materials having a sufficien potential barrier height. It was confirmed that GaP, AlP, $Al_xGa_{1-x}P$ (0<X<1), $GaAs_yP_{1-Y}$ (0<Y<1), $AlAs_{1-Y}P_Y$ (0<Y<1), $Al_xGa_{1-X}As_{1-Y}P_Y$ (0<X<1, 0<Y<1), $Al_xIn_{1-x}As_{1-Y}P_Y$ (0<X<1, 0<Y<1, 0.48<X+Y<2) are available for the electron barrier layers 84-1 and 84-2.

Figure 11:
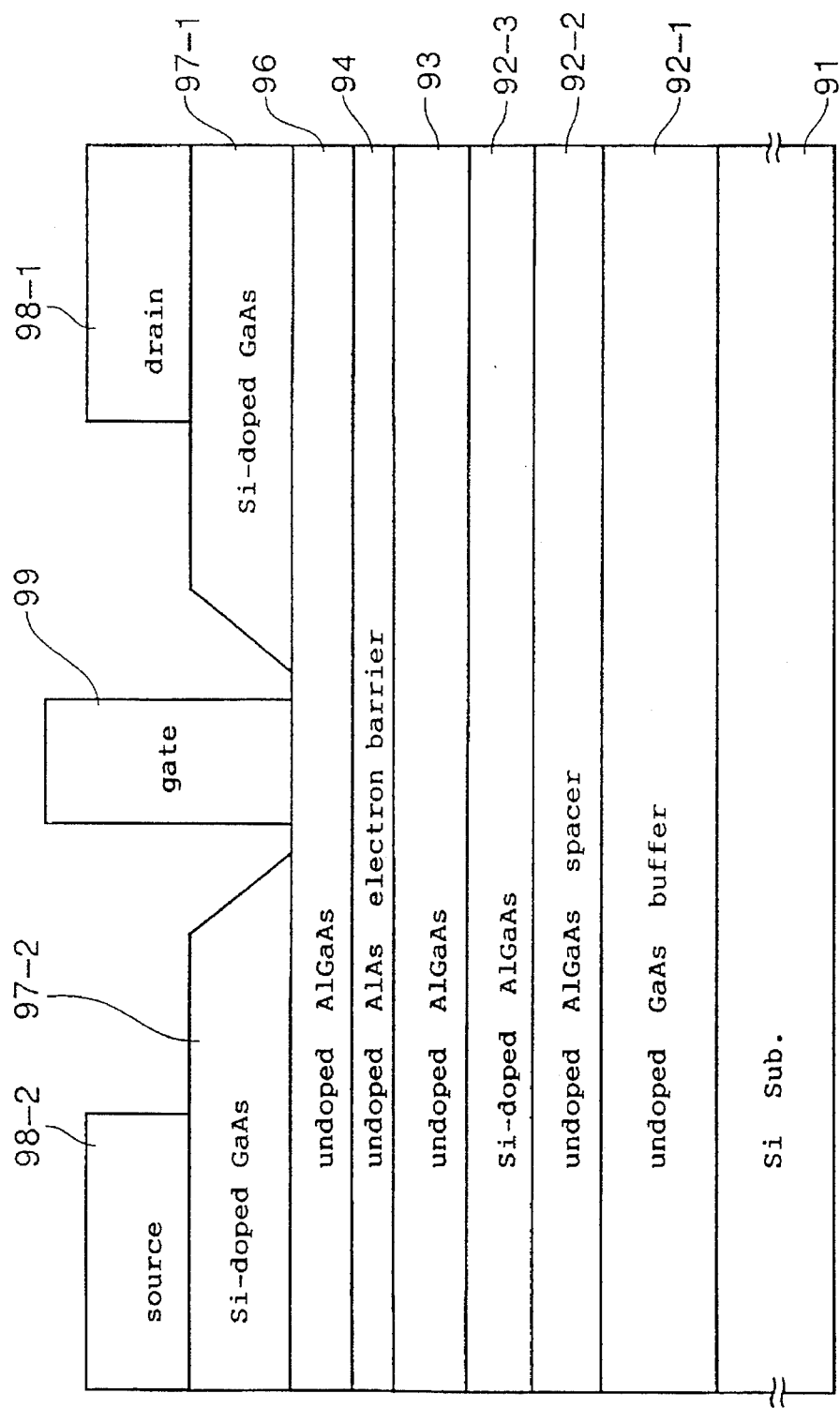
FIG. 11 is a fragmentary cross sectional elevation view illustrative of a novel high frequency and high speed field effect transistor having an improved Schottky barrier structure in a tenth embodiment according to the present invention.

A tenth embodiment according to the present invention will hereinafter be described with reference to FIG. 11 in which a novel high frequency and high speed field effect transistor having an improved Schottky gate structure is provided. A structure of the field effect transistor is illustrated in FIG. 11. The transistor has a silicon substrate 91. An undoped GaAs buffer layer 92-1 having a thickness of 800 nanometers is formed on the silicon substrate 91. An undoped $Al_{0.2}Ga_{0.8}As$ spacer layer 92-2 having a thickness of 3 nanometers is formed on the undoped GaAs buffer layer 92-1. A Si-doped AlGaAs channel layer 92-3 having a thickness of 40 nanometers and an impurity concentration of $2\times10^{18}$ cm$^{-3}$ is formed on the undoped AlGaAs spacer layer 92-2. An undoped AlGaAs layer 93 having a thickness of 20 nanometers is formed on the Si-doped AlGaAs channel layer 92-2. A single electron barrier layer 94 made of an undoped AlAs having a thickness of 5 nanometers is formed on the undoped AlGaAs layer 93. An undoped AlGaAs layer 66 having a thickness of 10 nanometers is formed on the electron barrier layer 94. A recess etched cap layer made of a Si-doped GaAs compound semiconductor having an impurity concentration of $6\times10^{18}$ cm$^{-3}$ constituting drain and source regions 97-1 and 97-2. Drain and source electrodes 98-1 and 98-2 are provided on the Si-doped GaAs drain and source regions 97-1 and 97-2. The drain and source electrodes 98-1 and 98-2 may be formed by evaporations of AuGe and Ni and subsequent alloy process therefor. A Schottky gate electrode 99 is provided on an exposed surface of the undoped AlGaAs layer 96 in a recess portion.

The above field effect transistor in this embodiment has an ideal Schottky barrier structure constituting a single potential barriers having a sufficient height to prevent electrons acting as carriers to flow across the Schottky contact surface from the Schottky gate electrode 99 into the AlGaAs layers or the undoped AlGaAs channel layer 92-3. The Schottky barrier structure has a single potential barrier comprising the undoped AlAs electron barrier layers 94. The dual undoped AlAs electron barrier layer 94 is provided at an adjacent portion to the Schootky contact surface to ensure a prevention of electrons acting as carriers to move across the Schottky contact surface from the Schottky gate electrode 99 into the AlGaAs layers and the channel layer 92-3. The undoped AlAs electron barrier layer 94 has a very small thickness of 5 nanometers which is less than a critical thickness to avoid any appearance of crystal dislocation due to a lattice mismatching between AlAs and AlGaAs. The above undoped AlAs electron barrier layer 94 is free from any problem with appearance of the crystal dislocation. On the other hand, the undoped AlAs electron barrier layer 94 has a sufficient height of the conduction band edge or a sufficient potential barrier height to permit a considerable low probability of tunneling of electrons through the electron barrier layer 94. Namely, such a sufficient height of the potential barrier or the conduction band edge of the AlAs electron barrier layer 94 is able to prevent electrons acting as carriers from the Schottky gate electrode to pass through the barrier layer.

The above single electron barrier layer 94 is provided not to be exposed in the recess portion or not directly to contact with the Schottky gate electrode. The electron barrier layer 94 is covered by the undoped AlGaAs layer 96. The undoped AlGaAs layer 96 is provided only to protect the AlAs electron barrier layer 94 from suffering any damage due to the recess etching process to form the recess portion in which the Schottky gate electrode 99 is provided. Although it is preferable to provide the electron barrier layer 94 in the vicinity of the Schottky contact surface, the AlGaAs layer 96 is necessary to protect the electron barrier layer 94 from any impact due to the recess etching process. The thickness of the AlGaAs layer 96 should be sufficient to achieve a perfect protection of the electron barrier layer 94 from any impact due to the recess etching process. For example, in replace of 10 nanometers thickness, 5 nanometers thickness would be acceptable for that purpose. Namely, the undoped AlGaAs layer 96 is to receive all impact due to the recess etching process to form the recess portion so that the second undoped AlAs barrier layer 94 covered and protected by the undoped AlGaAs layer 96 would be free from any impact due to the recess etching process. This permits the AlAs electron barrier layer 94 to exhibit an excellent and sufficient ability as the electron barriers to prevent electrons to flow across the Schottky barrier from the Schottky gate. This leads to no gate leakage current of the field effect transistor and a high yield of the transistor.

As modifications, the electron barrier layer 94 may be made by other compound semiconductor materials having a sufficien potential barrier height. It was confirmed that GaP, AlP, $Al_xGa_{1-x}P$ ($0<X<1$), $GaAs_YP_{1-Y}$ ($0<Y<1$), $AlAs_{1-Y}P_Y$ ($0<Y<1$), $Al_xGa_{1-x}As_{1-Y}P_Y$ ($0<X<1$, $0<Y<1$), $Al_xIn_{1-x}As_{1-Y}P_Y$ ($0<X<1$, $0<Y<1$, $0.48<X+Y<2$) are available for the electron barrier layer 94.

Whereas modifications of the present invention will no doubt be apparent to a person having ordinary skill in the art, to which the invention pertains, it is to be understood that the embodiments shown end described by way of illustration are by no means intended to be considered in a limiting sense. Accordingly, it is to be intended to cover by the claims all modifications of the present invention which fall within the sprite and scope of the invention.

What is claimed is:

1. A Schottky barrier structure comprising:
   a Schottky gate electrode;
   a first layer in contact with said Schottky gate electrode, said first layer being made of a first compound semiconductor which is undoped, and said first layer having a thickness in the range of 5–10 nanometers;
   a second layer in contact with said first layer, said second layer being made of a second compound semiconductor which is undoped and which has a higher conduction band edge than a conduction band edge of said first compound semiconductor;
   a third layer in contact with said second layer, said third layer being made of a third compound semiconductor which is undoped and which has a smaller conduction band edge than a conduction band edge of said second compound semiconductor, said third layer having a thickness of not less than 20 nanometers; and
   a fourth layer in contact with said third layer, said fourth layer being made of a fourth compound semiconductor which is doped with an impurity.

2. The Schottky barrier structure as claimed in claim 1, wherein said first compound semiconductor comprises a compound semiconductor including In.

3. The Schottky barrier structure as claimed in claim 2, wherein said first compound semiconductor comprises InAlAs.

4. The Schottky barrier structure as claimed in claim 1, wherein said second compound semiconductor comprises AlAs.

5. The Schottky barrier structure as claimed in claim 1, wherein said second compound semiconductor comprises GaAs.

6. The Schottky barrier structure as claimed in claim 1, wherein said second compound semiconductor comprises GaP.

7. The Schottky barrier structure as claimed in claim 1, wherein said second compound semiconductor comprises $In_xAl_{1-x}As$ ($0<X<0.4$).

8. The Schottky barrier structure as claimed in claim 1, wherein said second compound semiconductor comprises $Al_xGa_{1-x}As$ ($0<X<1$).

9. The Schottky barrier structure as claimed in claim 1, wherein said second compound semiconductor comprises $Al_xGa_{1-x}P$ ($0<X<1$).

10. The Schottky barrier structure as claimed in claim 1, wherein said second compound semiconductor comprises $GaAs_YP_{1-Y}$ ($0<Y<1$).

11. The Schottky barrier structure as claimed in claim 1, wherein said second compound semiconductor comprises $AlAs_{1-Y}P_Y$ ($0<Y<1$).

12. The Schottky barrier structure as claimed in claim 1, wherein said second compound semiconductor comprises $Al_xGa_{1-x}As_{1-Y}P_Y$ ($0<X<1$, $0<Y<1$).

13. The Schottky barrier structure as claimed in claim 1, wherein said second compound semiconductor comprises $Al_xIn_{1-x}As_{1-Y}P_Y$ ($0<X<1$, $0<Y<1$, $0.48<X+Y<2$).

14. The Schottky barrier structure as claimed in claim 1, wherein said second layer has a thickness of 5 nanometers.

15. The Schottky barrier structure as claimed in claim 1, wherein said third layer is made of the same material as said first compound semiconductor.

16. The Schottky barrier structure as claimed in claim 1, further comprising:
fifth and sixth layers sandwiched between said second layer and said third layer, wherein said fifth layer is in contact with said second layer and is made of the same material as said first compound semiconductor; and
wherein said sixth layer is in contact with said third layer and is made of the same material as said second compound semiconductor.

17. The Schottky barrier structure as claimed in claim 1, wherein said fourth layer is doped with Si at a doping concentration of $2 \times 10^{18}$ cm$^{-3}$.

18. A Schottky gate field effect transistor comprising:
a semiconductor substrate;
a first layer formed on said semiconductor substrate and said first layer being made of a first compound semiconductor;
a second layer formed on said first layer and said second layer being made of a second compound semiconductor having a higher conduction band edge than a conduction band edge of said first compound semiconductor, said second layer being undoped and having a thickness of not less than 20 nanometers;
a third layer formed on said second layer and said third layer including at least one electron barrier layer made of a third compound semiconductor having a higher conduction band edge than said conduction band edge of said second compound semiconductor, said third layer being undoped and having a thickness in the range of 5–10 nanometers;
a fourth layer formed on said third layer and said fourth layer being made of a fourth compound semiconductor having a lower conduction band edge than said conduction band edge of said third compound semiconductor;
source and drain regions separated through a recess portion from one another and formed on said fourth layer and said source and drain regions being made of a fifth compound semiconductor having a lower conduction band edge than said conduction band edge of said fourth compound semiconductor;
source and drain electrodes provided on said source and drain regions; and
a Schottky gate electrode provided on an exposed surface of said fourth layer in said recess portion.

19. The Schottky gate field effect transistor as claimed in claim 18, wherein said third layer comprises dual electron barrier layers sandwiching a fifth layer made of a fifth compound semiconductor having a higher conduction band edge than said conduction band edge of said third compound semiconductor.

20. The Schottky gate field effect transistor as claimed in claim 18, wherein said fourth compound semiconductor comprises a compound semiconductor including In.

21. The Schottky gate field effect transistor as claimed in claim 20, wherein said fourth compound semiconductor comprises InAlAs.

22. The Schottky gate field effect transistor as claimed in claim 18, wherein said fourth compound semiconductor comprises a compound semiconductor including GaAs.

23. The Schottky gate filed effect transistor as claimed in claim 18, wherein said third compound semiconductor comprises AlAs.

24. The Schottky gate field effect transistor as claimed in claim 18, wherein said third compound semiconductor comprises GaAs.

25. The Schottky gate field effect transistor as claimed in claim 18, wherein said third compound semiconductor comprises GaP.

26. The Schottky gate field effect transistor as claimed in claim 18, wherein said third compound semiconductor comprises In$_X$Al$_{1-X}$As (0<X<0.4).

27. The Schottky gate field effect transistor as claimed in claim 18, wherein said third compound semiconductor comprises Al$_X$Ga$_{1-X}$As (0<X<1).

28. The Schottky gate field effect transistor as claimed in claim 18, wherein said third compound semiconductor comprises Al$_X$Ga$_{1-X}$P (0<X<1).

29. The Schottky gate field effect transistor as claimed in claim 18, wherein said third compound semiconductor comprises GaAs$_Y$P$_{1-Y}$ (0<Y<1).

30. The Schottky gate field effect transistor as claimed in claim 18, wherein said third compound semiconductor comprises AlAs$_{1-Y}$P$_Y$ (0<Y<1).

31. The Schottky gate field effect transistor as claimed in claim 18, wherein said third compound semiconductor comprises Al$_X$Ga$_{1-X}$As$_{1-Y}$P$_Y$ (0X<1, 0<Y<1).

32. The Schottky gate field effect transistor as claimed in claim 18, wherein said third compound semiconductor comprises Al$_X$In$_{1-X}$As$_{1-Y}$P$_Y$ (0<X<1, 0<Y<1, 0.48<X+Y<2).

33. The Schottky gate field effect transistor as claimed in claim 18, wherein said electron barrier layer has a thickness of 5 nanometers.

34. The Schottky gate field effect transistor as claimed in claim 18, wherein said semiconductor substrate is made of a semi-insulating InP.

35. The Schottky gate field effect transistor as claimed in claim 18, wherein said semiconductor substrate is made of a semi-insulating GaAs.

36. The Schottky gate field effect transistor as claimed in claim 18, wherein said semiconductor substrate is made of silicon.

37. The Schottky gate field effect transistor as claimed in claim 19, wherein said fifth layer is made of InAlAs.

38. The Schottky gate field effect transistor as claimed in claim 19, wherein said fifth layer is made of AlGaAs.

39. The Schottky gate field effect transistor as claimed in claim 19, wherein said fifth layer has a thickness of 5 nanometers.

40. The Schottky gate field effect transistor as claimed in claim 18, wherein said second layer comprises:
an undoped InAlAs layer having a thickness of 3 nanometers formed on said first layer;
a Si-doped InAlAs layer having a thickness of 10 nanometers formed on said undoped InAlAs layer; and
an undoped InAlAs layer having a thickness of 20 nanometers formed on said Si-doped InAlAs layer.

41. The Schottky gate field effect transistor as claimed in claim 18, wherein said second layer comprises an undoped AlGaAs layer having a thickness of 20 nanometers formed on said first layer.

42. The Schottky gate field effect transistor as claimed in claim 18, wherein said source and drain regions are made of a Si-doped InGaAs having an impurity concentration of $6 \times 10^{18}$ cm$^{-3}$.

43. The Schottky gate field effect transistor as claimed in claim 18, wherein said source and drain regions are made of an n-doped GaAs having an impurity concentration of $6 \times 10^{18}$ cm$^{-3}$.

44. The Schottky gate field effect transistor as claimed in claim 18, further comprising an undoped InAlAs buffer layer having a thickness of 300 nanometers formed between said semiconductor substrate and said first layer.

45. The Schottky gate field effect transistor as claimed in claim 18, wherein said first layer comprises a Si-doped InGaAs having an impurity concentration of $2\times10^{18}$ cm$^{-3}$.

46. The Schottky gate field effect transistor as claimed in claim 18, wherein said first layer comprises a Si-doped AlGaAs having an impurity concentration of $2\times10^{18}$ cm$^{-3}$.

47. The Schottky gate field effect transistor as claimed in claim 18, further comprising an undoped GaAs buffer layer having a thickness in the range of from 400 nanometers to 800 nanometers formed between said semiconductor substrate and said first layer.

48. The Schottky gate field effect transistor as claimed in claim 47, further comprising an undoped $Al_{0.2}Ga_{0.8}As$ spacer layer having a thickness of 3 nanometers formed between said buffer layer and said first layer.

* * * * *